United States Patent
Shioi et al.

(10) Patent No.: US 8,674,388 B2
(45) Date of Patent: Mar. 18, 2014

(54) PHOSPHOR, METHOD OF MANUFACTURING THE SAME, AND LIGHT-EMITTING DEVICE

(75) Inventors: Kousuke Shioi, Chiba (JP); Naoto Hirosaki, Tsukuba (JP); Yuichi Michiue, Tsukuba (JP)

(73) Assignee: National Institute for Materials Science, Ibaraki (JP)

( * ) Notice: Subject to any disclaimer, the term of this patent is extended or adjusted under 35 U.S.C. 154(b) by 21 days.

(21) Appl. No.: 13/320,407

(22) PCT Filed: Aug. 4, 2010

(86) PCT No.: PCT/JP2010/063187
§ 371 (c)(1),
(2), (4) Date: Feb. 1, 2012

(87) PCT Pub. No.: WO2011/016486
PCT Pub. Date: Feb. 10, 2011

(65) Prior Publication Data
US 2012/0119234 A1  May 17, 2012

(30) Foreign Application Priority Data
Aug. 6, 2009 (JP) .................. P2009-183313

(51) Int. Cl.
*H01L 33/00* (2010.01)
(52) U.S. Cl.
USPC ............. 257/98; 257/99; 257/100; 257/40
(58) Field of Classification Search
USPC ................................ 257/98, 99, 100, 40
See application file for complete search history.

(56) References Cited

U.S. PATENT DOCUMENTS

| | | | |
|---|---|---|---|
| 6,066,861 A | 5/2000 | Hohn et al. | |
| 2007/0034834 A1* | 2/2007 | Liu et al. | 252/301.4 F |
| 2009/0091237 A1* | 4/2009 | Hirosaki et al. | 313/495 |
| 2010/0025632 A1 | 2/2010 | Fukuda et al. | |

FOREIGN PATENT DOCUMENTS

| | | |
|---|---|---|
| JP | 5-152609 A | 6/1993 |
| JP | 7-99345 A | 4/1995 |
| JP | 9-153644 A | 6/1997 |
| JP | 10-12925 A | 1/1998 |
| JP | 2900928 B2 | 6/1999 |

(Continued)

OTHER PUBLICATIONS

International Search Report for PCT/JP2010/063187 dated Sep. 7, 2010.

*Primary Examiner* — Tan N Tran
(74) *Attorney, Agent, or Firm* — Sughrue Mion, PLLC

(57) ABSTRACT

The present invention is a phosphor expressed by the general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$), as well as a manufacturing method for the same, and a light-emitting device that uses this phosphor.

23 Claims, 7 Drawing Sheets

(56) References Cited

FOREIGN PATENT DOCUMENTS

| JP | 2927279 B2 | 7/1999 |
| JP | 2002-171000 A | 6/2002 |
| JP | 2002-353554 A | 12/2002 |
| JP | 3364229 B2 | 1/2003 |
| JP | 2005-255895 A | 9/2005 |
| JP | 2006-232868 A | 9/2006 |
| JP | 2010-31201 A | 2/2010 |
| WO | 2009/031495 A1 | 3/2009 |
| WO | 2009/072043 A1 | 6/2009 |

* cited by examiner

PHOSPHOR, METHOD OF MANUFACTURING THE SAME, AND LIGHT-EMITTING DEVICE

TECHNICAL FIELD

The present invention relates to a phosphor that employs an inorganic compound as its main constituent, and to applications thereof. More specifically, these applications relate to light-emitting devices such as illumination devices or display units that fully utilize the properties of this phosphor, namely, the characteristic that this phosphor emits fluorescent light having a long wavelength of 400 nm or more.

Priority is claimed on Japanese Patent Application No. 2009-183313, filed Aug. 6, 2009, the contents of which are incorporated herein by reference.

BACKGROUND ART

Typically, phosphors are used in light-emitting devices such as display units such as vacuum fluorescent displays (VFD), field emission displays (FED), plasma display panels (PDP), cathode ray tubes (CRT), and light-emitting diodes (LED elements).

In each of these light-emitting devices, in order to cause the phosphor to emit light, it is necessary to supply some kind of energy to the phosphor in order to excite the phosphor. The phosphors are excited by a high-energy excitation source such as, for example, vacuum ultraviolet rays, ultraviolet rays, electron beams, blue light, and the like, and consequently emit visible light.

However, if conventional phosphors such as silicate phosphors, phosphate phosphors, aluminate phosphors, sulfide phosphors, and the like are used, then if these are exposed to the aforementioned types of excitation source, the problem arises that there is a reduction in the luminance of the phosphor.

Because of this, phosphors in which no reduction in luminance occurs even if they are exposed to these types of excitation source are being sought. Accordingly, oxynitride phosphors such as sialon phosphors have been proposed as phosphors in which there is little luminance reduction.

A sialon phosphor that contains Ca is disclosed in Patent document 1. Here, this sialon phosphor is manufactured via the manufacturing process described below.

Firstly, silicon nitride ($Si_3N_4$), aluminum nitride (AlN), calcium carbonate ($CaCO_3$), and europium oxide ($Eu_2O_3$) are blended at a predetermined mol ratio. Next, the blended mixture is held for one hour at a temperature of 1700° C. in nitrogen at one atmosphere (i.e., 0.1 MPa). Firing is then performed thereon using a hot-press method, resulting in a sialon phosphor being manufactured.

The $\alpha$-type sialon phosphor containing solid solution Eu ions which is obtained by this process is a phosphor that is excited by 450 to 500 nm blue light, and emits 550 to 600 nm yellow light. By combining this phosphor with blue LED elements, it is possible to manufacture white LED elements.

Patent document 2 concerns another sialon phosphor, and discloses a $\beta$-type sialon phosphor having a $\beta$-$Si_3N_4$ structure. Because this $\beta$-type sialon phosphor emits 500 to 600 nm green to orange light when it is excited by near-ultraviolet to blue light, it is favorably used as a phosphor for white LED elements.

Furthermore, an oxynitride phosphor formed by a JEM phase is disclosed in Patent document 3. This oxynitride phosphor is excited by near-ultraviolet to blue light, and emits light having an emission wavelength peak in a range of 460 to 510 nm. The excitation/emission wavelength range of this phosphor makes it favorable as a blue phosphor for a white LED which uses a near-ultraviolet LED as an excitation source.

In contrast, a white light-emitting diode obtained by combining a blue light-emitting diode element with a blue absorption/yellow emission phosphor is known as a conventional example of the light-emitting device technology used as an illumination device, and is put to use in various types of illumination.

For example, a white light-emitting diode obtained by combining a blue light-emitting diode element with a blue absorption/yellow emission phosphor is disclosed in Patent document 4. In addition, a light-emitting diode having the same type of structure is disclosed in Patent document 5. Furthermore, a light-emitting diode having the same type of structure is also disclosed in Patent document 6 as a light-emitting element which utilizes a wavelength conversion material.

Note that the phosphors which are used particularly often in these light-emitting diodes are represented by the general formula $(Y, Gd)_3(Al, Ga)_5O_{12}:Ce^{3+}$, and are yttrium-aluminum-garnet-based phosphors that are activated by cerium.

Moreover, a phosphor-equipped light-emitting diode which is provided with a semiconductor light-emitting element which emits either ultraviolet light or near-ultraviolet light and with a phosphor is disclosed in Patent document 7. This document discloses a structure in which, in this phosphor-equipped light-emitting diode, the semiconductor light-emitting element emits either ultraviolet light or near-ultraviolet light using pulse-shaped large current, and the phosphor which is formed as a film on the surface of the element is excited by the light emission of this semiconductor light-emitting element. In this structure, the emission color of this phosphor-equipped light-emitting diode can be switched between blue, green, or red light in accordance with the type of phosphor that is formed as a film on the surface of the element.

Moreover, a dot matrix type of display unit which is provided with a light-emitting layer which is formed by a III-group nitride semiconductor, and three types of phosphor layers that receive ultraviolet light having a peak wavelength of 380 nm for the wavelength of the light emitted from this light-emitting layer and then respectively emit light in the three primary colors of red, green and blue is disclosed in Patent document 8.

Furthermore, a semiconductor light-emitting element that emits white light using a semiconductor light-emitting element that emits light having a wavelength of 390 through 420 nm, and a phosphor that is excited by the light emitted from the semiconductor light-emitting element is disclosed in Patent document 9. Here, because the semiconductor light-emitting element emits light which has limited visibility to humans, the sensation is created that even if the intensity and wavelength of the light emitted by the semiconductor light-emitting element are varied there is substantially no change in the color tone. Moreover, light which has a wavelength of between 390 and 420 nm tends not to damage the device component elements such as the resin in which the phosphor is dispersed. In addition, generally, ultraviolet light has various harmful effects on the human body, however, because light having a wavelength of 390 nm or more is used, there are no harmful effects from leakage excitation light. In this case, phosphors of various oxides and sulfides are used for the phosphor that emits light upon being excited by light having a wavelength of between 390 and 420 nm.

Illumination devices such as these can be manufactured using a known method such as those described, for example, in Patent document 10 and Patent document 11.

PRIOR ART LITERATURE

Patent Documents

Patent document 1: Japanese Patent Application Laid-Open (JP-A) No. 2002-363554
Patent document 2: Japanese Patent Application Laid-Open (JP-A) No. 2005-255895
Patent document 3: Japanese Patent Application Laid-Open (JP-A) No. 2006-232868
Patent document 4: Japanese Patent Publication No. 2900928
Patent document 5: Japanese Patent Publication No. 2927279
Patent document 6: Japanese Patent Publication No. 3364229
Patent document 7: Japanese Patent Application Laid-Open (JP-A) No. H10-12925
Patent document 8: Japanese Patent Application Laid-Open (JP-A) No. H9-153644
Patent document 9: Japanese Patent Application Laid-Open (JP-A) No. 2002-171000
Patent document 10: Japanese Patent Application Laid-Open (JP-A) No. H5-152609
Patent document 11: Japanese Patent Application Laid-Open (JP-A) No. H7-99345

DISCLOSURE OF THE INVENTION

Problems to be Solved by the Invention

However, the phosphors described in Patent documents 1 through 11 have suitable excitation/emissions spectrums for white LED applications that use light-emitting elements ranging from near-ultraviolet through blue as an excitation light source, however, due to the increasing need in recent years for greater white LED luminance, the appearance of phosphors having even higher levels of luminance is anticipated.

Furthermore, in the case of light-emitting devices for illumination and the like, because white light-emitting diodes that are formed by blue light-emitting diode elements and yttrium-aluminum-garnet-based phosphors have insufficient red components, they emit bluish white light and a bias is apparent in their color rendering. In addition to this problem, because oxide phosphors, in particular, have a low covalency, the problem arises that the increase in the amount of generated heat, which is a consequence of the increased luminance of the semiconductor light-emitting element, causes a reduction in the emission luminance.

Moreover, sulfide-based phosphors that exhibit high emission luminance are known, however, because there are drawbacks in their chemical stability, it has been difficult to secure the long-life characteristics that are the inherent feature of white LED.

The present invention was conceived in view of the above described circumstances and it is an object thereof to provide a phosphor that exhibits even higher luminance and superior stability than a conventional phosphor, and to provide a method of manufacturing the same, as well as a light-emitting device that uses this phosphor.

Means for Solving the Problems

As a result of repeated intense research undertaken to try and solve the above described problems, the present inventors discovered that a phosphor which is characterized in that its composition is expressed by the general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$) exhibited high luminance light emission.

As a result of making further research into this discovery, the present inventors were able to complete the present invention which is illustrated in the following structure.

(1) The general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$).

(2) The phosphor according to (1), wherein the value of n/m is $(8/5)<n/m<(5/3)$, and the value of x is $0<x\leq0.2$.

(3) The phosphor according to (1) or (2), wherein the element A is one or more types selected from Ca, Sr, and Ba.

(4) The phosphor according to any one of (1) through (3), wherein the element R is Eu.

(5) The phosphor according to any one of (1) through (4), wherein the element M is one or more types selected from Si and Al.

(6) The phosphor according to any one of (1) through (5), wherein the phosphor is expressed by the general formula $(A_{1-x}R_x)_mSi_{6n-5m-s}Al_{7m-4n+s}O_sN_{m+4n-s}$ (wherein s is a real number defined by $0\leq s\leq m$).

(7) The phosphor according to any one of (1) through (6), wherein the concentration of the luminescent material is 80% by volume or more, and the remainder is one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1), and $SrSi_6N_8$.

(8) A method of manufacturing a phosphor comprising: a mixing step in which a starting raw material is mixed so as to prepare a mixed raw material a firing step in which this mixed raw material is fired; and a heat treatment step in which the mixed raw material obtained in the previous step is heat treated, wherein the phosphor is expressed by the general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$), and when the element A is one or more types of element selected from elements that have a divalent valency, the starting raw material contains one or more types of raw material selected from $ASi_2$, $ASiN_2$, $A_2Si_5N_8$, $A_3Al_2N_4$, and $ASi_6N_8$.

(9) The method of manufacturing a phosphor according to (8), wherein there are further provided: a first pulverizing and classifying step in which the mixed raw material obtained from the firing step is pulverized and classified; and a second pulverizing and classifying step in which the mixed raw material-obtained from the heat treatment step is pulverized and classified, and the aforementioned previous step is the first pulverizing and classifying step.

(10) The method of manufacturing a phosphor according to (8) or (9), wherein the starting raw material contains $LiSi_2N_3$.

(11) The method of manufacturing a phosphor according to any one of (8) through (10), wherein a powder of a target phosphor is synthesized in advance, and this is added as a seed to the mixed raw material.

(12) A light-emitting device that is provided with an emission light source and a phosphor, wherein the phosphor described in any one of claims 1 through 7 is used for the phosphor.

(13) The light-emitting device according to (12), wherein the phosphor further contains one or more types of phosphor selected from $\beta$-SiAlON:Eu, YAG:Ce, $(Ca, Sr, Ba)_2SiO_4$:Eu, $\alpha$-SiAlON:Eu, $(Ca, Sr, Ba)_2Si_5N_8$:Eu, and $(Ca, Sr) AlSiN_3$:Eu.

(14) The light-emitting device according to (12) or (13), wherein the emission light source is an LED chip, an inorganic EL chip, or an organic EL chip that emits light having a wavelength of 330 to 500 nm.

(15) The light-emitting device according to any one of (12) through (14), wherein the emission light source is an LED chip that emits light having a wavelength of 330 to 500 nm, and the phosphor is dispersed in a sealing resin that is formed so as to enclose the LED chip.

(16) The light-emitting device according to (15), wherein the phosphor is dispersed in the sealing resin such that it is densely dispersed in the vicinity of the LED chip.

(17) The light-emitting device according to any one of (12) through (16), wherein the emission light source is an LED chip that emits light having a wavelength of 330 to 500 nm, and the phosphor is directly adhered to the LED chip.

(18) The light-emitting device according to (17), wherein the phosphor is directly adhered such that it covers at least one surface of the LED chip.

(19) The light-emitting device according to (18), wherein the phosphor has a layer structure.

(20) The light-emitting device according to any one of (12) through (19), wherein the light-emitting device contains a plurality of LED chips.

In the phosphor of any of the above described (1) through (7), it is preferable for the particles to be fine particles having a mean particle diameter of not less than 0.1 μm and not more than 50 μm.

In the phosphor of any of the above described (1) through (7), it is preferable for the mean aspect ratio to be 20 or more.

In the phosphor of any of the above described (1) through (7), it is preferable for between 5 and 300 ppm of fluorine to be contained therein.

In the phosphor of any of the above described (1) through (7), it is preferable for between 10 and 3000 ppm of boron to be contained therein.

In the phosphor of any of the above described (1) through (7), it is preferable for a transparent film to be formed on at least a portion of the surface of the phosphor of the present invention and, if $n_k$ is the refractive index of the transparent film, for the thickness of the transparent film to be $(10\sim180)/n_k$ (units: nm). It is more preferable for the refractive index of the transparent film $n_k$ to be not less than 1.2 and not more than 2.5, and still more preferable for it to be not less than 1.5 and not more than 2.0.

In the method of manufacturing a phosphor of any of the above described (8) through (11), it is preferable for lumps of the mixed raw material obtained after the firing to be pulverized by a pulverizer formed by grinding media or lining materials which are made from an alumina sintered compact, a zirconium oxide sintered compact, a silicon nitride sintered compact, or an $\alpha$-sialon sintered compact until the lumps have a mean particle diameter of 50 μm or less.

In the method of manufacturing a phosphor of any of the above described (8) through (11), it is preferable for lumps of the heat-treated material obtained after the firing to be pulverized by a pulverizer formed by grinding media or lining materials which are made from an alumina sintered compact, a zirconium oxide sintered compact, a silicon nitride sintered compact, or an $\alpha$-sialon sintered compact until the lumps have a mean particle diameter of 20 μm or less.

In the method of manufacturing a phosphor of any of the above described (8) through (11), it is preferable for the pulverized lumps of mixed raw material obtained after firing to be classified by elutriation.

In the method of manufacturing a phosphor of any of the above described (8) through (11), it is preferable for the pulverized lumps of heat-treated material obtained after firing to be classified by elutriation.

In the method of manufacturing a phosphor of any of the above described (8) through (11), it is preferable for the particle diameters of the aggregate of the raw material powder to be regulated by spray-drying the mixed raw material.

In the method of manufacturing a phosphor of any of the above described (8) through (11), it is preferable for the mixing step to be a step in which the raw material powder is mixed together with a solvent using a wet mill.

In the method of manufacturing a phosphor of any of the above described (8) through (11), it is preferable for the firing step to be a step in which the firing is performed in a nitrogen atmosphere having a pressure of not less than 0.1 MPa and not more than 100 MPa in a temperature range of not less than 1500° C. and not more than 2200° C.

In the method of manufacturing a phosphor of any of the above described (8) through (11), it is preferable for the firing step to be a step in which the firing is performed in the presence of carbon or a carbon-containing compound.

In the method of manufacturing a phosphor of any of the above described (8) through (11), it is preferable for the firing step to be a step in which the firing is contained within a firing vessel.

In the method of manufacturing a phosphor of any of the above described (8) through (11), it is preferable for the firing step to be a step in which the firing is performed with the filling rate being held to a bulk density of 40% or less.

In the method of manufacturing a phosphor of any of the above described (8) through (11), it is preferable for the firing step to be a step in which the firing is performed with the filling quantity of the mixed raw material being held to 20% or more by volume as a ratio between the bulk volume of the mixed raw material and the volume of the firing vessel.

In the method of manufacturing a phosphor of any of the above described (8) through (11), it is preferable for the material used for the firing vessel to be any one of alumina, calcia, magnesia, graphite, or boron nitride.

In the method of manufacturing a phosphor of any of the above described (8) through (11), it is preferable for the heat treatment step to be a step in which the heat treatment is performed in an atmosphere of one type or two or more types selected from nitrogen, ammonia, and hydrogen at a temperature of not less than 600° C. and not more than 2200° C.

In the method of manufacturing a phosphor of any of the above described (8) through (11), it is preferable for there to be provided a transparent film formation step in which the phosphor powder is suspended in an organic solvent, and an organometallic complex or metal alkoxide is dropped into this suspension solution and an ammonia aqueous solution, so that a transparent film is formed on at least a portion of the surface of the phosphor.

In the method of manufacturing a phosphor of any of the above described (8) through (11), it is preferable for there to be provided a transparent film formation step in which the phosphor powder is suspended in water, and a metal salt aqueous solution is dropped into this while a constant pH is maintained, so that a transparent film is formed on at least a portion of the surface of the phosphor.

In the light-emitting device of the above described (14), it is preferable for the maximum intensity of the emission wavelength of the LED chip to be between 330 and 500 nm. It is also preferable for the emitted light from the LED chip to be ultraviolet light.

In the light-emitting device of the above described (14), it is preferable for the maximum intensity of the emission wavelength of the LED chip to be between 380 and 410 nm.

In the light-emitting device of the above described (14), it is preferable for the emitted light from the LED chip to be blue in color.

In the light-emitting device of the above described (14), it is preferable for a white color LED device to be created as a result of the phosphor being excited by the LED chip. It is also preferable for the white emission color from the LED device to have a color rendering of 70 or more. It is also preferable for the emission spectrum of the LED device to have a half width of 100 nm or greater.

In the light-emitting device of the above described (14), it is preferable for a colored LED device to be created as a result of the phosphor being excited by the LED chip which generates ultraviolet rays. It is also preferable for a green LED device to be created, or for a blue-green LED device to be created, or for a blue LED device to be created as a result of the phosphor being excited by the LED chip which generates ultraviolet rays.

In the light-emitting device of the above described (14), it is preferable for the light-emitting device to be a molded type LED device or a surface-mounted LED device. It is also preferable for the light-emitting device to be a chip-on-board type of device in which the LED chip is directly mounted on a wired substrate.

In the light-emitting device according to any of the above described (14) to (20), it is preferable for resin to be contained in the substrate and/or the reflector portion of the light-emitting device. It is also preferable for the resin to be thermosetting resin.

In the light-emitting device according to any of the above described (14) to (20), it is preferable for a ceramic component to be contained in the substrate and/or the reflector portion of the light-emitting device.

In the light-emitting device according to the above described (15), it is preferable for the sealing resin to contain silicone resin in at least a portion of the area thereof. It is also preferable for the sealing resin to contain methyl silicone resin in at least a portion of the area thereof. It is also preferable for the sealing resin to contain phenyl silicone resin in at least a portion of the area thereof.

In the light-emitting device according to the above described (15) and (16), it is preferable for another sealing resin to be formed such that it covers the sealing resin.

In the light-emitting device according to the above described (19), it is preferable for the thickness of the phosphor to be between 1 μm and 100 μm.

In the light-emitting device according to any of the above described (14) to (20), it is preferable for the LED chip to be larger than the surface area of 350 μm square.

In the light-emitting device according to any of the above described (14) to (20), it is preferable for the light-emitting device to be used while it is being supplied with 0.2 W or more of power per package.

In the light-emitting device according to any of the above described (14) to (20), it is preferable for the LED chip to be used with supplied electric power for each white light-emitting device package that is equivalent to a surface area power density of $1.5 \times 10^4$ W/m$^2$ for each LED chip.

In the light-emitting device according to any of the above described (14) to (20), it is preferable for the LED chip to be used with supplied electric power for each white light-emitting device package that is equivalent to a surface area power density of $5 \times 10^4$ W/m$^2$ for each LED chip.

EFFECTS OF THE INVENTION

According to the above described structure, it is possible to provide a phosphor that exhibits higher luminance and superior stability compared to a conventional phosphor, and to also provide a method of manufacturing the same, and a light-emitting device that uses this phosphor.

Because the phosphor of the present invention is characterized in that its composition is expressed by the general formula $(A_{1-x}R_xM_2X)_m(M_2X_4)_n$, wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$, it is possible to obtain a light emission intensity having a sufficiently high luminance.

Because the phosphor of the present invention is formed by the above described phosphor and by additional materials to this phosphor, and because the concentration of the above described phosphor is 80% by volume or more, and the remainder is one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1), and $SrSi_6N_8$, it is possible to obtain a sufficiently high light emission intensity.

If the phosphor of the present invention has a structure in which the particles thereof have a mean particle diameter of not less than 0.1 μm and not more than 50 μm, there are no effects from surface defects, and there is sufficient absorption of excitation light, and emitted light can be obtained at a high intensity.

If the phosphor of the present invention has a structure in which the mean aspect ratio of the primary particles making up the phosphor is 20 or less, not only is there an improvement in the dispersibility of the phosphor in resin, but excitation light is efficiently absorbed and a sufficiently high light emission intensity can be obtained.

If the phosphor of the present invention has a structure in which minute quantities of fluorine or boron are contained therein as impurities, then the light emission intensity can be further improved.

In the phosphor manufacturing method of the present invention, if A is one or more types of element selected from elements that have a divalent valency, then because a structure is employed in which, as the compound which contains A, it is possible for at least one or more types of raw material selected from $ASi_2$, $ASiN_2$, $A_2Si_5N_8$, $A_3Al_2N_4$, and $ASi_6N_8$ to be used as the starting raw material, the reactivity in the firing step is improved, and it is possible to obtain a phosphor having even brighter luminance.

Moreover, in the phosphor manufacturing method of the present invention, if a structure is employed in which, as a compound that contains Li, $LiSi_2N_3$ is included at least as the starting raw material, then the reactivity in the firing step is improved, and it is possible to obtain a phosphor having even brighter luminance.

In the phosphor manufacturing method of the present invention, if a structure is employed in which a phosphor powder having a previously synthesized target composition is added as a seed to the mixed raw material, the synthesizing reaction is accelerated so that synthesizing at a low temperature becomes possible, and a phosphor having an even greater degree of crystallinity can be obtained, and the light emission intensity of the phosphor can be improved.

Here, if necessary, it is also possible to blend a flux into the mixed raw material. As the flux it is possible to use halides of alkaline metals or halides of alkaline earth metals, and these may be added, for example, within a range of 0.01 to 20 parts by mass relative to 100 parts by mass of the phosphor raw material.

Aggregates of the mixed raw material powder are obtained by means of a mixing step in which the raw material powder is mixed together with a solvent in a wet mill, and a granulation step in which the particle diameters of the aggregate of raw material powder are regulated by spray-drying the mixed material obtained from the mixing step using a spray-drier.

In the phosphor manufacturing method of the present invention, if a structure is employed in which the firing step is performed in a nitrogen atmosphere having a pressure of not less than 0.1 MPa and not more than 100 MPa and in a temperature range of not less than 1500° C. and not more than 2200° C., then there is no volatility in the raw material compound or changes in composition thanks to the atmospheric pressure being sufficient, and the temporal efficiency is excellent thanks to the temperature being sufficient. Moreover, there is no melting of the raw material, and it is possible to obtain a phosphor having a high emission intensity.

In the phosphor manufacturing method of the present invention, if a structure is employed in which the firing step is performed in the presence of carbon or a carbon-containing compound, then because the mixed raw material is in contact with a reducing atmosphere, in particular, in cases in which a mixed raw material containing a large quantity of oxygen is used, it is possible to obtain a high-luminance phosphor.

In the phosphor manufacturing method of the present invention, if a structure is employed in which the firing step is performed with the filling rate is held to a bulk density of 40% or less, then the demands of economy and product quality can both be satisfied.

Moreover, as the method used to place the aggregate of raw material powder blend in a state in which the filling rate is held to a bulk density of 40% or less, it is possible to employ a method in which the aggregate powder granulated in the granulation step is housed inside a firing vessel and is fired while inside this firing vessel.

In the phosphor manufacturing method of the present invention, if a structure is employed in which the firing step is performed with the filling quantity of the mixed raw material being held to 20% or more by volume as a ratio between the bulk volume of the mixed raw material and the volume of the firing vessel, then a high-luminance phosphor can be obtained.

In the phosphor manufacturing method of the present invention, if a structure is employed in which lumps obtained after the firing are pulverized by a pulverizer formed by grinding media or lining materials which are made from an alumina sintered compact, a zirconium oxide sintered compact, a silicon nitride sintered compact, or an x-sialon sintered compact until the lumps have a mean particle diameter of 20 μm or less, then it is possible to control the ingress of impurities in the pulverizing step.

Moreover, in the phosphor manufacturing method of the present invention, if a structure is employed in which the heat treatment step is performed in an atmosphere of one type or two or more types selected from nitrogen, ammonia, and hydrogen at a temperature of not less than 600° C. and not more than 2200° C., then any defects introduced in the pulverizing step are reduced, and the light emission intensity can be restored.

The phosphor of the present invention is characterized in that its composition is expressed by the general formula $(A_{1-x}R_xM_2X)_m(M_2X_4)_n$, wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by 0<x<1, however, if the phosphor of the present invention is expressed, for example, by the general formula $(A_{1-x}R_x)_mSi_{6n-5m-s}Al_{7m-4n+s}O_sN_{m+4n-s}$ (wherein s is a real number defined by 0≤s≤m), then the oxygen content contained in the phosphor powder of the present invention may be greater than an oxygen content (s) calculated based on the aforementioned general formula. The difference in these oxygen contents is 0.4% or less. Here, the oxygen difference is provided by a transparent film which is formed on at least a portion of the surface of the particles of powder of the phosphor of the present invention.

In the phosphor of the present invention, if a structure is employed in which a transparent film having a thickness of $(10\sim180)/n_k$ (units: nm) is formed on at least a portion of the surface of the particles making up the above described phosphor (here, $n_k$ is the refractive index of the transparent film, and is between 1.2 and 2.5), then the oxidation resistance of the particles is improved, and the refractive index difference with the sealing resin is reduced. As a result, any loss of light at the interfaces between the phosphor and the sealing resin can be reduced. Note that it is more preferable for the refractive index of the transparent film $n_k$ to be not less than 1.5 and not more than 2.0.

Examples of the method used to form the transparent film on at least a portion of the surface of the particles of powder of the phosphor of the present invention include a method in which the phosphor of the present invention is suspended in an organic solvent, and into this suspension solution is dropped an organometallic complex or metal alkoxide, or a method in which the phosphor of the present invention is suspended in water, and a metal salt aqueous solution is dropped into this water while the pH thereof is kept constant.

In the light-emitting device of the present invention, because a structure is employed in which the light-emitting apparatus is formed by an emission light source and a phosphor, and because the phosphor of the present invention is used as this phosphor, it is possible to create a light-emitting device having sufficiently high levels of luminance and color rendering.

In the light-emitting device of the present invention, because a structure is employed in which the emission light source is any one of an LED chip, an inorganic EL chip, or an organic EL chip that emits light having a wavelength of 330 to 500 nm, the phosphor of the present invention can be excited efficiently, and it is possible to create a light-emitting device having even higher levels of luminance and color rendering.

In the light-emitting device of the present invention, because a structure is employed in which the light-emitting device is formed by an emission light source and a phosphor, and because the light-emitting device uses this phosphor and also one or more types of phosphor selected from β-SiAlON:Eu, YAG:Ce, (Ca, Sr, Ba)$_2$SiO$_4$:Eu, α-SiAlON:Eu, (Ca, Sr, Ba)$_2$Si$_5$N$_8$:Eu, and (Ca, Sr)AlSiN$_3$:Eu, it is possible to obtain a light-emitting device having high levels of color rendering.

BEST MODE FOR CARRYING OUT THE INVENTION

Figure 1:
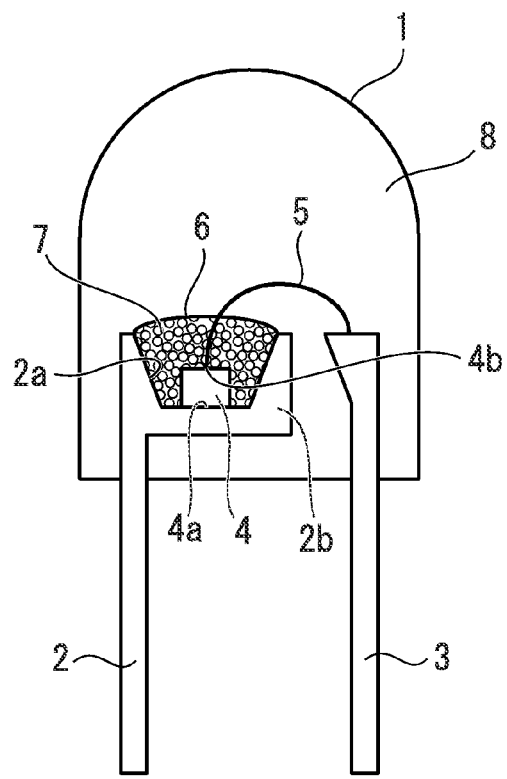
FIG. 1 is a cross-sectional view of a light-emitting device (i.e., LED lighting equipment) according to a first embodiment of the present invention.

Hereinafter, embodiments for implementing the present invention will be described.
(1) Phosphor
The phosphor of the present invention is characterized in that its composition is expressed by the general formula (A$_{1-x}$R$_x$M$_2$X)$_m$(M$_2$X$_4$)$_n$, wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by 0<x<1.

By employing this structure it is possible to obtain a sufficiently high light emission intensity. Note that the values of x, m, and n are preferably within the following ranges: (8/5)<n/m<(5/3), 0<x≤0.2. If the values are outside these ranges, this leads to an undesirable reduction in the luminance intensity.

Moreover, in the phosphor of the present invention, it is also possible for the concentration of the luminescent material to be 80% by volume or more, and for the remainder to be one or more types selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$(n~1), and SrSi$_6$N$_8$. By employing this structure it is possible to obtain a sufficiently high light emission intensity. Note that the remainder may be either a crystalline phase or an amorphous phase. Note also that if the concentration of the luminescent material is less than 80% by volume, a sufficiently high light emission intensity cannot be obtained.

In the phosphor of the present invention, the value of n/m is within a range of (8/5)<n/m<(5/3), however, a range of 1.61≤n/m≤1.65 is more preferable. If the value of n/m is 1.61≤n/m≤1.65, then an even higher light emission intensity can be obtained.

In the phosphor of the present invention, the value of the oxygen content (s) is 0≤s≤m, however, a range of 0.25 m≤s≤0.75 m is more preferable. If the value of s is outside this range, the content of the crystalline phase or amorphous phase remainder which is one or more types selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$(n~1), and SrSi$_6$N$_8$ increases, and this leads to an undesirable reduction in the light emission intensity.

In the phosphor of the present invention, the value of x is 0<x≤0.2, however, a preferable range for the value of x is 0.001<x≤0.1, and a more preferable range for the value of x is 0.01<x≤0.06. If the value is too small, then the number of atoms emitted is too few so that a sufficient light emission intensity cannot be obtained. If, on the other hand, this value is too large, concentration quenching causes the light emission intensity to decrease, and neither of these outcomes is satisfactory. Moreover, by varying the value of x, the emission spectrum of the phosphor can be varied between 480 and 540 nm.

For the element A, it is possible to use one or more types of element selected from Li, Na, Be, Mg, Ca, Sr, Ba, Sc, Y, La, Gd, and Lu. One or more types of element selected from Ca, Sr, and Ba is particularly preferable as these enable a sufficiently high light emission intensity to be obtained. Sr is even more preferable. If a portion of the Sr is replaced with Ca, the emission color shifts to the long wavelength side, while if a portion of the Sr is replaced with Ba, the emission color shifts to the short wavelength side.

For the element R, it is possible to use one or more types of element selected from Mn, Ce, Pr, Nd, Sm, Eu, Tb, Dy, Ho, Er, Tm, and Yb. These are all activating agents. Of these, one or more types of element selected from Ce, Eu, and Yb is particularly preferable for the element R. Note that in the phosphor of the present embodiment, if R is Ce then it shows white blue emission light, while if R is Eu then it shows blue green emission light, and if R is Yb then it shows green emission light.

[Mean Particle Diameter]

The phosphor of the present invention is preferably made up of fine particles (i.e., a powder) whose mean particle diameter is within a range of not less than 0.1 µm and not more than 50 µm.

If the mean particle diameter is smaller than 0.1 µm, the effects resulting from surface defects become conspicuous and there is a decrease in the light emission intensity. If, on the other hand, the mean particle diameter is larger than 50 µm, the excitation light absorption is insufficient, and there is a decrease in the emission light, and neither of these outcomes is satisfactory. Note that the particle size of the phosphor can be measured using a laser diffraction/scattering method.

[Mean Aspect Ratio]

The mean aspect ratio of the primary particles making up the phosphor powder of the present invention is preferably 20 or less. By employing this structure, not only is there an improvement in the dispersibility of the phosphor in resin, but excitation light is efficiently absorbed and a sufficiently high light emission intensity can be obtained.

If the mean aspect ratio is greater than 20, it becomes difficult for the particles to be mixed into resin, and gaps are easily generated at the interfaces between the resin and the phosphor particles. Moreover, if the mean aspect ratio is greater than 20, the particles may become mutually entangled, and the absorption of the excitation light by the phosphor particles which are arrayed in parallel with the excitation light may become insufficient, and a sufficiently high light emission intensity might not be obtained which is not a satisfactory outcome.

Note that if the shape of the primary particles making up the phosphor powder is a planar shape, the aspect ratio is determined from the shape of the cross-section thereof.

[Minor Additional Elements]

In the phosphor of the present invention, when relationships between the minor additional elements and the emission characteristics were examined, it was discovered that a greater level of excellence was obtained in the emission characteristics when 5 through 300 ppm of fluorine or 10 through 3000 ppm of boron were added.

This phenomenon was conspicuous when more than 5 ppm of fluorine were added and when more than 10 ppm of boron were added, however, it was not possible to obtain any greater effect than that already achieved when more than 300 ppm of the former and more than 3000 ppm of the latter were added.

[Oxygen Content]

If the oxygen content contained in the phosphor of the present invention is more than a value calculated based on the aforementioned general formula $(A_{1-x}R_xM_2X)_m(M_2X_4)_n$ by an amount of 0.4% or less by mass, there is a further improvement in the emission characteristics.

Here, an oxygen content which is more than 0.4% or less by mass creates a transparent film which is formed on at least a portion of the surface of the phosphor powder particles. This transparent film improves the oxidation resistance of the phosphor powder particles, and lowers the refractive index difference with the sealing resin. As a result, any loss of light at the interfaces between the phosphor and the sealing resin is reduced. Furthermore, because unpaired electrons and defects on the phosphor particle surfaces are reduced, this is effective in improving the light emission intensity.

[Transparent Film]

It is also possible for a transparent film to be formed on at least a portion of the surfaces of the fine particles of the phosphor of the present invention. The thickness of the transparent film is $(10\sim180)/n_k$ (units: nm), wherein $n_k$ is the refractive index of the transparent film and is between 1.2 and 2.5, and more preferably is not less than 1.5 and not more than 2.0.

If the thickness of the transparent film is thicker than this range, then the transparent film itself absorbs light. Because this reduces the light emission intensity, it is undesirable. If, on the other hand, the thickness of the transparent film is thinner than this range, it becomes difficult to form a uniform transparent film, and the effect in reducing loss of light at interfaces between the phosphor and the sealing resin becomes insufficient, which is not a satisfactory outcome.

Note that, generally, the appropriate thickness for the transparent film is prescribed by the refractive index $n_k$ of the transparent film, and in the case of a transparent film having a high refractive index, even if the thickness thereof is thin, the aim of reducing light loss is still achieved, while in the case of a transparent film having a low refractive index, it is necessary to increase the thickness in order to achieve this aim.

Suitable materials for the transparent film include inorganic substances such as silica, alumina, titania, magnesia, magnesium fluoride or the like, resins such as polystyrene, polycarbonate, polymethylstyrene or the like, and the like.

[Dispersibility]

It is also possible to perform coupling processing on the surface of the powder particles of the phosphor of the present invention. By doing this, when the phosphor is being dispersed in resin, not only can the dispersibility of the phosphor be improved, but the adhesion between the resin and the phosphor can also be improved.

As the coupling agent it is possible to use a silane coupling agent, a titanate-based coupling agent, or an aluminate-based coupling agent or the like. If necessary, the coupling processing may also be performed after the formation of the transparent film.

[Conductive Inorganic Substance]

If the phosphor of the present invention is to be used in applications where it is excited by electron beams, then by mixing it with a conductive inorganic substance the phosphor can be provided with conductivity.

Examples of this conductive inorganic substance include oxides, oxynitrides, and nitrides that include one type or two or more types of element selected from Zn, Al, Ga, In, and Sn, and also compounds of these.

[Inorganic Phosphors and Fluorescent Dyes]

If necessary, it is also possible for an inorganic phosphor or a fluorescent dye that develops a different color from the emission color of the luminescent material used in the phosphor of the present invention to be blended with the phosphor of the present invention.

Compared with a normal oxide phosphor, the phosphor of the present invention which is obtained in the above described manner has a broad excitation range from electron beams, X-rays, and ultraviolet rays through to visible light, and particularly when Eu is used as an activating agent, displays green blue light through to blue light in a range from 480 to 540 nm.

Due to these emission characteristics, the phosphor of the present invention is suitable for light-emitting equipment such as lighting equipment, display equipment, image display devices, pigments, and ultraviolet absorbers and the like. In addition to this, they also have superior heat resistance in that they show no deterioration when exposed to high temperatures, and also have superior stability for prolonged periods in oxidizing atmospheres and wet environments.

(2) Phosphor Manufacturing Method

The method used to manufacture the phosphor of the present invention is not particularly limited, however, the following method enables a phosphor having a high level of luminance to be manufactured.

The phosphor manufacturing method of the present invention is provided with a step (i.e., a mixing step) in which a raw material is mixed so as to form a mixed raw material, a step (i.e., a firing step) in which this mixed raw material-is fired, a step (i.e., a first pulverizing and classifying step) in which lumps of the fired mixed raw material are pulverized and classified, a step (i.e., a heat treatment step) in which the fired mixed raw material is heat treated, and a step (i.e., a second pulverizing and classifying step) in which lumps of the heat treated material are pulverized and classified.

Note that it is also possible for the first and second pulverizing and classifying steps to be omitted.

[Mixing Step]

As the raw material of A it is possible to use metals, silicides, oxides, carbonates, nitrides, oxynitrides, chlorides, fluorides, oxy-fluorides, hydroxides, oxalates, sulfates, nitrates, organic metal compounds, and compounds or composite compounds of A that form oxides, nitrides, and oxynitrides when heated.

As the raw material of R it is possible to use metals, silicides, oxides, carbonates, nitrides, oxynitrides, chlorides, fluorides, oxy-fluorides, hydroxides, oxalates, sulfates, nitrates, organic metal compounds, or compounds or composite compounds of R that form oxides, nitrides, and oxynitrides when heated.

Furthermore, as the raw material of M it is possible to use metals, silicides, oxides, carbonates, nitrides, oxynitrides, chlorides, fluorides, oxy-fluorides, hydroxides, oxalates, sulfates, nitrates, organic metal compounds, or compounds or composite compounds of M that form oxides, nitrides, and oxynitrides when heated.

Of these, oxides and nitrides are preferable as the raw material of R, oxides, carbonates, nitrides, and silicides are preferable as the raw material of A, and nitrides, oxides, and silicides are preferable as the raw material of M.

Note that if a phosphor that contains Eu as an activating agent is synthesized using a trivalent europium raw material as a starting raw material, then, as the trivalent raw material, it is preferable for europium nitride or europium oxide to be used as starting raw material for the mixed raw material.

Europium oxide is reduced to divalent by the firing step. Moreover, generally, oxygen is contained as a normal impurity in a nitride raw material, and this oxygen or the oxygen contained in the europium oxide creates impurities in the phosphor or forms a constituent element of another crystalline phase.

Furthermore, if the mixed raw material is fired in the presence of carbon or a carbon-containing compound, the europium oxide is strongly reduced and the oxygen content decreases.

Europium shows superior light emission if it is positively divalent. Consequently, if a compound that contains trivalent europium is used as the raw material, it is necessary to reduce it in the firing step.

The proportions of divalent and trivalent europium out of the total europium contained in the phosphor of the present invention are desirably set such that divalent europium is the greater, and it is preferable for the proportion of divalent europium out of the total europium to be 50% or more, and more preferably 80% or more.

If there is any resicomposite trivalent europium, the stoichiometric composition becomes disproportional and there is a reduction in the light emission intensity, which is not a preferable outcome.

Note that the proportions of divalent and trivalent europium can be analyzed using an X-ray absorption fine structure (XAFS) analysis method.

Note also that, if necessary, the powder of the phosphor of the present invention can be synthesized in advance, and this can then be added as a seed to the mixed raw material and the two materials then blended together. If this seed is added, the synthesizing reaction is accelerated so that synthesizing at a low temperature becomes possible and, in some cases, a phosphor having an even greater degree of crystallinity can be obtained, and the light emission intensity improved.

The amount of seed that is added is preferably within a range of 1 to 50 parts by mass relative to 100 parts by mass of the phosphor raw material.

In the phosphor manufacturing method of the present invention, when A is one or more types of element selected from elements that have a divalent valency, then as the compound which contains A, it is possible for one or more types of raw material selected from $ASi_2$, $ASiN_2$, $A_2Si_5N_8$, $A_3Al_2N_4$, and $ASi_6N_8$ to be used as at least the starting raw material. It is also possible for $LiSi_2N_3$ to be included in the starting raw material as a compound that contains Li.

When a phosphor that contains A or Li and has a composition in which the value of s is less than m is being synthesized, then it is necessary to use a nitride or the like of A or Li as the raw material, however, because these nitrides are easily oxidized in air, steps such as weighing and blending and the like must be performed in a glove box from which air has been shut out. Furthermore, generally, the mixed raw material is loaded into a firing furnace and is exposed to the air until the air inside the furnace is removed. Consequently, even if steps such as weighing and blending and the like are performed in a glove box, it is impossible to avoid a certain amount of oxidation in the mixed raw material.

In contrast, because compounds such as $ASi_2$, $ASiN_2$, $A_2Si_5N_8$, $A_3Al_2N_4$, and $ASi_6N_8$ are stable in air, steps such as weighing and blending, as well as the time taken from when the mixed raw material is loaded into the firing furnace until the air inside the furnace is removed pose no concerns.

The raw material powder can also be blended by a dry mill which does not utilize any solvent, however, generally, the raw material powder is blended by a wet mill together with solvent. Using a wet mill which utilizes a solvent makes it possible to obtain a microscopically uniform blended powder in a short span of time.

The type of mill used may be a ball mill, a vibrating mill, or an attrition mill or the like, however, a ball mill is preferable from the standpoint of equipment costs.

The solvent that is used for the blending may be ethanol, methanol, isopropanol, hexane, acetone, or water or the like, however, in consideration of safety and of preventing oxidation of the raw material powder, either ethanol or hexane are preferable.

The proportions of the raw material powder and the blend solvent determine the viscosity of the blended slurry. A preferable viscosity for the blended slurry is approximately 50 to 500 cps. If the viscosity of the blended slurry is less than 50 cps, too much energy is required to dry the blended slurry, which is not desirable. If, on the other hand, the viscosity of the blended slurry exceeds 500 cps, the time required until a uniform blended powder is obtained is too long, which is also not desirable.

[Granulation Step]

It is also possible to provide a granulation step in which the particle diameters of the aggregate of raw material powder are regulated by spray-drying the mixed raw material. By doing this, it is possible to obtain an aggregate of the raw material powder which has superior fluidity and is easy to handle.

After the raw material powder has been blended with a solvent using a wet mill so as to prepare a blended slurry, this is dried so as to form a blended powder. It is possible for the obtained blended slurry to be left sitting in a drier or the like so that the solvent is allowed to evaporate, however, if a spray drier is used, then a blended powder from which the solvent has been removed quickly can be obtained without any concern arising that the raw material powder may become separated once again. Moreover, because a blended powder that has been obtained using a spray drier exhibits a granularity from several tens to several hundreds of micrometers, it has superior fluidity and is easy to handle.

If necessary, the blended powder may be made into a molded object having a bulk density of 40% or less by compression molding. By forming the raw material powder into a molded object, it is possible to prevent it being scattered by the vacuum deaeration in the firing step.

[Firing Step]

The firing is performed by placing the mixed raw material in a firing container in a nitrogen atmosphere at a pressure of not less than 0.1 MPa and not more than 100 MPa.

If the pressure of the nitrogen atmosphere is less than 0.1 MPa, the volatility of the mixed raw material becomes conspicuous, and changes are generated in the composition so that the light emission intensity is reduced. On the other hand, even if the pressure of the nitrogen atmosphere is increased beyond than 100 MPa, there is no change in the mixed raw material volatility suppression effect so that, as a result, it becomes uneconomical, and neither of these outcomes is desirable.

The firing is performed in a temperature range of not less than 1500° C. and not more than 2200° C. If the firing temperature is less than 1500° C., a prolonged period of time is needed to obtain the phosphor of the present invention, while if the firing temperature is higher than 2200° C., the raw material starts to melt, and neither of these outcomes is desirable.

Due to the firing temperature being extremely high and the firing atmosphere containing nitrogen, the furnace used for the firing is preferably a metal resistance-heating type or a graphite resistance-heating type of furnace, and an electrical furnace which utilizes carbon for the material used for the high-temperature portion of the furnace is particularly preferable for the reasons described below as well. The method used for the firing is preferably one in which no mechanical pressure is applied from the outside such as a normal pressure sintering method, or a gas pressure sintering method as these sintering methods allow the firing to be performed with the bulk density being kept at a low level.

It is preferable for the firing to be performed in the presence of carbon or a carbon-containing compound as, due to the fact that the mixed raw material is in contact with a reducing atmosphere, in particular, in cases in which a mixed raw material containing a large quantity of oxygen is used, this enables a high-luminance phosphor to be obtained.

The carbon or carbon-containing compound used here may be amorphous carbon, graphite, or silicon carbide or the like, and is not particularly limited, however, amorphous carbon, graphite and the like are preferable. Carbon black, graphite powder, activated carbon, silicon carbide powder and the like, as well as molded articles made from these materials, and sintered compacts and the like are also examples of usable carbons or carbon-containing compounds, and each of these enable a similar effect to be obtained.

The method used to combine the materials may be one in which powdered carbon is included in the mixed raw material, or one in which a firing vessel made from carbon or a carbon-containing compound is used, or one in which carbon or a carbon-containing compound is placed either inside or outside a firing vessel which is formed from a material other than carbon or a carbon-containing compound, or one in which a heat generator or a heat insulator made from carbon or a carbon-containing compound is used. Whichever of these combining methods is used, it is possible for a similar effect to be obtained.

The blended powder of the above described mixed raw material is desirably fired with the filling rate thereof being held to a bulk density of 40% or less.

The reason why firing is performed with the filling rate of the blended powder of the raw material being held to a bulk density of 40% or less is because, if the firing is performed while free spaces are present around the raw material powder, reaction products experience crystal growth in the free spaces and reduce the amount of contact between crystals, so that it is possible to synthesize crystals having few surface defects.

Note that 'bulk density' is the volumetric filling rate of the powder, and is a value obtained by dividing the ratio between the mass and volume when the powder is loaded into the firing vessel by the theoretical density of the metal compound.

Moreover, the material used for the firing vessel can be alumina, calcia, magnesia, graphite, or boron nitride, however, a boron nitride sintered compact is suitable due to its low reactivity with a metal compound.

When the filling rate is being held to a bulk density of 40% or less, as a ratio between the bulk volume of the mixed raw material and the volume of the firing vessel, it is preferable for the filling quantity of the mixed raw material to be 20% or more by volume.

By performing the firing with the filling quantity of the mixed raw material being set to 20% or more by volume of the volume of the firing vessel, volatilization of the volatile constituents contained in the mixed raw material is suppressed, and any change in composition during the firing step is suppressed. In addition, the filling quantity of the mixed raw material inside the firing vessel increases, which is economically advantageous.

[First Pulverizing and Classifying Step]

Lumps of the mixed raw material obtained after the firing, namely, fired lumps that contain the phosphor of the present invention are pulverized by a pulverizer (i.e., a crushing machine) which is normally used in a workplace such as a ball mill or jet mill formed by grinding media or lining materials which are made from an alumina sintered compact, a zirconium oxide sintered compact, a silicon nitride sintered compact, or an α-sialon sintered compact.

The pulverization is continued until the lumps reach a mean particle diameter of 50 μm or less. If the mean particle diameter exceeds 50 μm, the fluidity of the powder and its ability to disperse in resin deteriorates. Accordingly, when the powder is combined with a light-emitting element and used to form a light-emitting device, the light emission intensity is non-uniform in some locations. It is more preferable for the pulverizing to continue until the mean particle diameter reaches 20 μm or less.

The lower limit of the mean particle diameter is not particularly limited, however, because a long time is generally required if the powder is pulverized to a particle size of 0.5 μm or less and a large number of defects also appear on the surface of the phosphor powder, this may cause a reduction in the light emission intensity.

The reason why grinding media or lining materials are made from an alumina sintered compact, a zirconium oxide sintered compact, a silicon nitride sintered compact, or an α-sialon sintered compact is because these inhibit the entry of impurities in the pulverizing step, and any impurities that do get in do not drastically reduce the light emission intensity.

Note that it is undesirable for the pulverizing to be performed using a pulverizer that is formed by a grinding media or lining material containing iron or iron group elements as this causes the phosphor to take on a black color, and causes the iron or iron group element to become incorporated into the phosphor during the heat processing step (described below), so that there is a marked reduction in the light emission intensity.

The phosphor powder obtained by this pulverizing may be classified if necessary so that a desired grain size distribution can be obtained.

The method used for this classification may involve classifying using a screen, wind-blown classification, precipitation in a liquid, or classification using tube concentrators. It is preferable for the pulverized lumps to be classified by elutriation.

Note that it is also possible for this classifying step to be performed after the surface treatment step.

[Heat Treatment Step]

If necessary, the phosphor powder after the firing, or the phosphor powder after the pulverization processing, or the phosphor powder whose particle size has been controlled via classifying may be subjected to a step in which they are heat treated in an atmosphere of one type or two or more types selected from nitrogen, ammonia, and hydrogen at a temperature of not less than 600° C. and not more than 2200° C. By employing this method, it is possible, for example, to reduce defects which were introduced in the pulverizing step, and to restore the light emission intensity.

It is not preferable for the heat treatment temperature to be lower than 600° C. as this reduces the effect of removing defects in the phosphor, and requires a long time for the light emission intensity to be restored.

On the other hand, it is not preferable for the heat treatment temperature to be higher than 2200° C. as this may cause a portion of the phosphor powder to melt, or may cause the particles to become re-adhered to each other.

The heat treatment may be performed in an atmosphere of one type or two or more types selected from nitrogen, ammonia, and hydrogen. If the heat treatment is performed in these atmospheres, there is no oxidation of the phosphor powder and any defects can be removed.

Moreover, it is preferable for the atmospheric pressure to be the same as that in the firing, namely, not less than 0.1 MPa and not more than 100 MPa. If the atmospheric pressure is less than 0.1 MPa, a portion of the phosphor component elements is volatilized by the heat treatment temperature, and the light emission intensity is reduced. If, on the other hand, the nitrogen atmospheric pressure is increased to more than 100 MPa, there is no further effect towards suppressing volatilization of the mixed raw material, so that any further increase in the atmospheric pressure is uneconomical and is therefore undesirable.

Furthermore, by washing the product material after firing in a solvent formed by water or by an aqueous solution of acid, it is possible to reduce the content of the glass phase, secondary phase, or impurity phase in the product material, and thereby improve the luminance. In this case, the acid can be selected from one of sulfuric acid, hydrochloric acid, nitric acid, hydrofluoric acid, and organic acid or from blends of these. Among these, if a blend of hydrofluoric acid and sulfuric acid is used, the effect of removing impurities is considerably improved.

[Second Pulverizing and Classifying Step]

If necessary, it is also possible, in the same way as in the first pulverizing and classifying step, to pulverize lumps of the fired heat-treated material to a mean particle diameter of 20 μm or less using a pulverizer which is formed by grinding media or lining materials which are made from an alumina sintered compact, a zirconium oxide sintered compact, a silicon nitride sintered compact, or an α-sialon sintered compact.

[Transparent Film Formation Step]

If necessary, a transparent film formation step in which a transparent film is formed on at least a portion of the surface of the phosphor may be performed.

The method used to form a transparent film of the surface of the phosphor of the present invention may be one in which, using, for example, a stirrer or an ultrasonic dispersion system, the phosphor powder is suspended in an organic solvent such as alcohol, and into this suspension solution is dropped an alkaline aqueous solution such as an organometallic complex or metal alkoxide and an ammonia aqueous solution. As a result, a metallic oxide or metal hydroxide film is formed on the particle surfaces of the phosphor. If necessary, the phosphor can then be fired in air or in a non-oxidative atmosphere of nitrogen or the like. The thickness of the transparent film can be controlled by changing the dropping conditions, or the stirring or suspension conditions.

It is also possible for the phosphor powder to be suspended in water (or an acid, or an alkaline whose pH has been adjusted or buffer solution) using a stirrer or an ultrasonic dispersion system, and to then drop into this a metal salt aqueous solution while the pH thereof is kept constant. After an oxide or hydroxide film of this metal has been formed on the particle surfaces of the phosphor, the phosphor is filtrated, washed, and dried. If necessary, the phosphor can then be fired in air or in a non-oxidative atmosphere of nitrogen or the like. Note that in this method as well, the thickness of the transparent film can be controlled by changing the dropping conditions, or the stirring or suspension conditions of the metal salt aqueous solution.

[Impurities]

In order to obtain a phosphor having a high level of emission luminance, it is preferable to reduce the impurity content to an absolute minimum. Because the light emission is obstructed if a large quantity of Fe, Co, or Ni impurity elements, in particular, are contained therein, it is preferable for the selection of the raw material powder and the control of the synthesizing step to be performed such that the total of these elements is 500 ppm or less.

Because the phosphor manufacturing method of the present invention employs a structure in which the mixed raw material which is used to create the phosphor of the present invention is fired in a nitrogen atmosphere at a pressure of not less than 0.1 MPa and not more than 100 MPa, and in a temperature range of not less than 1500° C. and not more than 2200° C., it is possible to obtain a phosphor having a high light emission intensity.

(3) Light-Emitting Device

The light-emitting device of the present invention is constructed using at least an emission light source and the phosphor of the present invention. Examples of an illumination device which utilizes this light-emitting device include LED illumination devices, EL illumination devices, and fluorescent lamps and the like.

For example, an LED illumination device can be manufactured using the phosphor of the present invention by employing a known method such as those described in Japanese Patent Application Laid-Open (JP-A) Nos. 5-152609 and 7-99345.

First Embodiment

A molded type white light-emitting diode lamp (i.e., an LED illumination device: an LED device) will now be described as a first embodiment of the light-emitting device of the present invention.

FIG. 1 is a cross-sectional view of a molded type white light-emitting diode lamp 1 which is the first embodiment of the light-emitting device of the present invention.

As is shown in FIG. 1, the molded type white light-emitting diode lamp 1 is provided with a first lead wire 2, and a second lead wire 3. The first lead wire 2 has a recessed portion 2a, and a light-emitting diode element (i.e., an LED chip) 4 is mounted inside this recessed portion 2a. A bottom electrode 4a of the light-emitting diode element 4 is electrically connected by means of conductive paste to a bottom surface of the recessed portion 2a, while a top electrode 4b thereof is electrically connected by a bonding wire (i.e., a fine gold wire) 5 to the second lead wire 3.

A first resin (i.e., sealing resin) 6 is a transparent resin in which a phosphor 7 has been dispersed, and which covers the entire light-emitting diode element 4. A distal end portion 2b of the first lead wire 2 which includes the recessed portion 2a which contains the first resin 6 in which the phosphor 7 has been dispersed, the light-emitting diode element 4, and the first resin 6 in which the phosphor 7 has been dispersed are sealed by a transparent second resin (i.e., another sealing resin) 8.

The overall shape of the second resin 8 is a substantially circular column with the distal end portion thereof being formed as a lens-shaped curved surface and is, therefore, commonly referred to as being molded type. Silicon resin is preferable as the material for both the first resin 6 and the second resin 8, however, another resin such as polycarbonate resin or epoxy resin, or a transparent material such as glass or the like may also be used. As far as possible, it is preferable for a material that undergoes minimal deterioration under ultraviolet light to be selected.

The same resin or different resins may be used for both the first resin 6 and the second resin 8, however, from the standpoints of simplifying manufacturing and adhesiveness, it is preferable for the same resin to be used.

If a phosphor 7 having a transparent film formed on a portion of the surface thereof is used, then it is preferable for the refractive index of the first resin 6 in which the phosphor 7 is dispersed to be close to the refractive index of the transparent film. By doing this, reflection at the interface between the transparent film and the first resin 6 can be suppressed.

Note that in this case, if a resin (i.e., a second resin) which has a lower refractive index than the first resin is placed on the outside of the first resin 6 in which the phosphor 7 has been dispersed, then it is possible to create a light-emitting device having an even greater luminance.

Because a structure is employed in which the phosphor 7 which is dispersed in the first resin 6 is excited by the emission of light from the light-emitting diode element (i.e., the LED chip) 4, it is possible to improve the emission intensity. Moreover, a variety of emission colors can be displayed. Furthermore, in the case of white emissions, the color rendering can be increased.

Second Embodiment

A substrate-mounted chip type of white light-emitting diode lamp (i.e., an LED illumination device: an LED device) will now be described as a second embodiment of the light-emitting device of the present invention.

Figure 2:
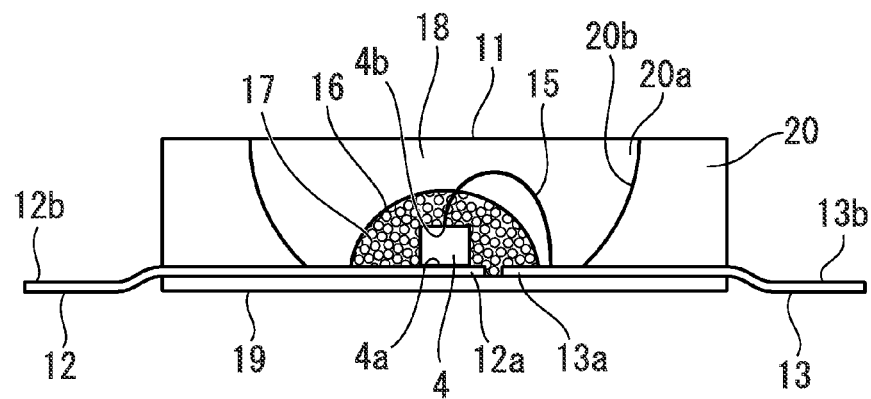
FIG. 2 is a cross-sectional view of a light-emitting device (i.e., LED lighting equipment) according to a second embodiment of the present invention.

FIG. 2 is a cross-sectional view of a substrate-mounted chip type of white light-emitting diode lamp 11 which is the second embodiment of the light-emitting device of the present invention.

As is shown in FIG. 2, a first lead wire 12 and a second lead wire 13 which are mounted on a ceramic substrate 19 which utilizes a white alumina ceramic having a high visible light reflectance are fixed to the substrate-mounted chip type of white light-emitting diode lamp 11, and ends 12a and 13a of these are placed substantially in a center portion of the substrate 19, while opposite-side ends 12b and 13b both protrude to the outside and form electrodes that are soldered when the light-emitting device is mounted onto an electrical substrate. The light-emitting diode element (i.e., LED chip) 4 is mounted on and fixed to the end 12a of the first lead wire 12 so as to be located in the center portion of the substrate. The bottom electrode 4a of the light-emitting diode element 4 is electrically connected by means of conductive paste to the first lead wire 12, while the top electrode 4b thereof is electrically connected by a bonding wire (i.e., a fine gold wire) 15 to the second lead wire 13.

A first resin (i.e., sealing resin) 16 is a transparent resin in which a phosphor 17 has been dispersed, and covers the entire light-emitting diode element 4. A wall surface component 20 is fixed onto the ceramic substrate 19, and a bowl-shaped hole 20a is formed in a center portion of the wall surface component 20.

The hole 20a contains the light-emitting diode 4 and the first resin 16 in which the phosphor 17 has been dispersed, and portions thereof that face the center are formed as a sloping surface 20b. This sloping surface 20b is a reflective surface that is used to extract light in a forward direction, and the curvature of the sloping surface 20b is decided based on the light reflection direction. Moreover, at least the sloping surface 20b which forms a reflective surface is formed as a high visible light reflectance surface which has a white or metallic luster.

The wall surface component 20 may be formed, for example, from a white silicon resin or the like, and the hole 20a in the center portion thereof is formed as a recessed portion shaped like the final shape of the chip-type of light-emitting diode lamp. Here, the hole 20a is filled with a second resin (i.e., another sealing resin) 18 that seals all of the light-emitting diode element 4 and the first resin 16 in which the phosphor 17 has been dispersed.

Silicon resin is preferable as the material for both the first resin 16 and the second resin 18, however, another resin such as polycarbonate resin or epoxy resin, or a transparent material such as glass or the like may also be used. As far as possible, it is preferable for a material that undergoes minimal deterioration under ultraviolet light to be selected.

The same resin or different resins may be used for both the first resin 16 and the second resin 18, however, from the standpoints of simplifying manufacturing and adhesiveness, it is preferable for the same resin to be used.

Because a structure is employed in which the phosphor 17 which is dispersed in the first resin 16 is excited by the emission of light from the light-emitting diode element (i.e., the LED chip) 4, it is possible to improve the emission intensity. Moreover, a variety of emission colors can be displayed. Furthermore, in the case of white emissions, the color rendering can be increased.

Third Embodiment

A substrate-mounted chip type of white light-emitting diode lamp (i.e., an LED illumination device: an LED device) will now be described as a third embodiment of the light-emitting device of the present invention.

Figure 3:
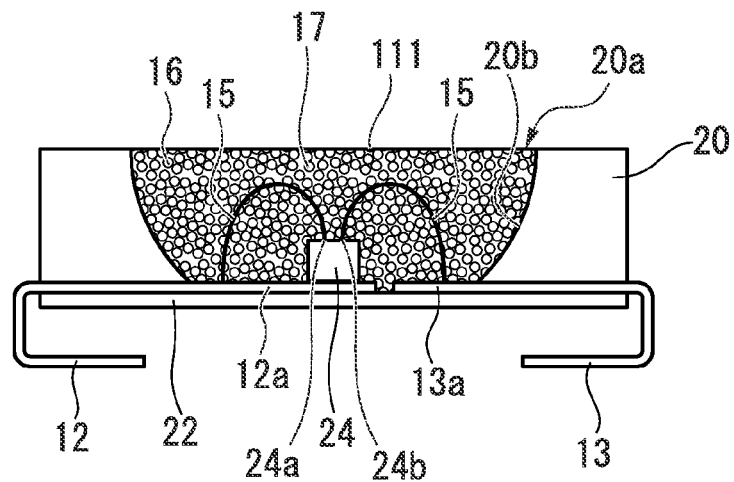
FIG. 3 is a cross-sectional view of a light-emitting device (i.e., LED lighting equipment) according to a third embodiment of the present invention.

FIG. 3 is a cross-sectional view of a substrate-mounted chip type of white light-emitting diode lamp 111 which is the third embodiment of the light-emitting device of the present invention.

As is shown in FIG. 3, the first lead wire 12 and the second lead wire 13 which are mounted on the ceramic substrate 19 which utilizes a white alumina ceramic having a high visible light reflectance are fixed to the substrate-mounted chip type of white light-emitting diode lamp 111, and the ends 12a and 13a of these are placed substantially in the center portion of the substrate 19, while the opposite-side ends 12b and 13b both protrude to the outside and form electrodes that are soldered when the light-emitting device is mounted onto an electrical substrate. A light-emitting diode element (i.e., LED chip) 24 is mounted on and fixed to the end 12a of the first lead wire 12 so as to be located in the center portion of the substrate.

Note that a blue LED chip in the form of a square whose sides are 350 μm long is used as the light-emitting diode element 24, and this is die-bonded by means of resin paste to the top of the first lead wire (i.e., lead) 12. In addition, copper lead frames which have been silver plated are used for the lead wires (i.e., leads) 12 and 13, and a ceramic substrate molded from a nylon resin is used for the substrate 19.

A light-emitting element that has two electrodes 24a and 24b formed on the surface on one side thereof is used for the light-emitting diode element 24. One electrode 24a is electrically connected by a bonding wire (i.e., a fine gold wire) 15 to the first lead wire (i.e., lead) 12, while another electrode 24b is electrically connected by a bonding wire (i.e., a fine gold wire) 15 to the second lead wire (i.e., lead) 13.

In the same way as in the second embodiment, the wall surface component 20 is provided. A suitable quantity of the first resin 16 which contains the phosphor is trickled down such that it covers the light-emitting diode element 24 and fills the hole 20a in the wall surface component 20. This is then cured so as to form a substrate-mounted chip type of white light-emitting diode lamp (i.e., LED illumination device) (light-emitting device).

Note that, as the light-emitting diode element 24, it is also possible to prepare a light-emitting device package by packaging a plurality of blue LED chips in the form of a square whose sides are 350 μm long, and to then trim this package so as to form a light-emitting device package that is made up of individual pieces. These are then selected based on their color tone, and emission intensity, and used to form a product.

Because a structure is employed in which the phosphor 17 which is dispersed in the first resin 16 is excited by the emission of light from the light-emitting diode element (i.e., the LED chip) 24, it is possible to improve the emission intensity. Moreover, a variety of emission colors can be displayed. Furthermore, in the case of white emissions, the color rendering can be increased.

Fourth Embodiment

A substrate-mounted chip type of white light-emitting diode lamp (i.e., an LED illumination device: an LED device) will now be described as a fourth embodiment of the light-emitting device of the present invention.

Figure 4:
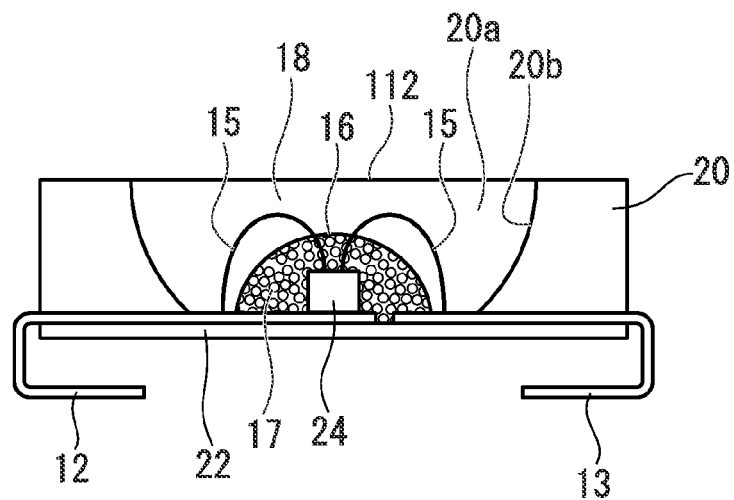
FIG. 4 is a cross-sectional view of a light-emitting device (i.e., LED lighting equipment) according to a fourth embodiment of the present invention.

FIG. 4 is a cross-sectional view of a substrate-mounted chip type of white light-emitting diode lamp 112 which is the fourth embodiment of the light-emitting device of the present invention.

As is shown in FIG. 4, apart from the fact that a second resin 118 in which no phosphor has been dispersed is provided, a substrate-mounted chip type of white light-emitting diode lamp 112 has the same structure as the light-emitting device 111 of the third embodiment. The light-emitting diode element (i.e., LED chip) 24 is mounted on and fixed to the center portion of the substrate. Note that the same symbols are used for the same components.

Because a structure is employed in which the phosphor 17 which is dispersed in the first resin (i.e., sealing resin) 16 is excited by the emission of light from the light-emitting diode element (i.e., the LED chip) 24, it is possible to improve the emission intensity. Moreover, a variety of emission colors can be displayed. Furthermore, in the case of white emissions, the color rendering can be increased.

Fifth Embodiment

A substrate-mounted chip type of white light-emitting diode lamp (i.e., an LED illumination device: an LED device) will now be described as a fifth embodiment of the light-emitting device of the present invention.

Figure 5:
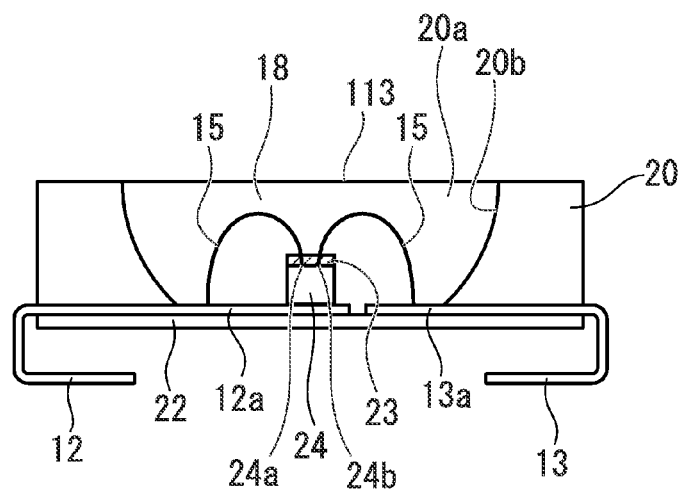
FIG. 5 is a cross-sectional view of a light-emitting device (i.e., LED lighting equipment) according to a fifth embodiment of the present invention.

FIG. 5 is a cross-sectional view of a substrate-mounted chip type of white light-emitting diode lamp 113 which is the fifth embodiment of the light-emitting device of the present invention.

As is shown in FIG. 5, apart from the fact that a phosphor 23 is directly adhered so as to cover an entire surface of the light-emitting diode element (i.e., LED chip) 24, and the fact that the second resin (i.e., another sealing resin) 18 in which no phosphor has been dispersed is formed such that it covers the light-emitting diode element 24 and fills the hole 20a in the wall surface component 20, the substrate-mounted chip type of white light-emitting diode lamp 113 has the same structure as the light-emitting device 111 of the third embodiment. The light-emitting diode element (i.e., LED chip) 24 is mounted on and fixed to the center portion of the substrate. Note that the same symbols are used for the same components.

Because a structure is employed in which the phosphor 23 which is formed on an entire surface of the light-emitting diode 24 is excited by the emission of light from the light-emitting diode element (i.e., the LED chip) 24, it is possible to improve the emission intensity. Moreover, a variety of emission colors can be displayed. Furthermore, in the case of white emissions, the color rendering can be increased.

Hereinafter, a description of the structure and effects that are common to each of the first through fifth embodiments will be described.

[Emission Light Source]

The emission light source (i.e., the light-emitting diode elements 4 and 24) desirably emits light having a wavelength of between 330 and 470 nm, and, of this, ultraviolet (or violet) light-emitting elements having a wavelength of between 330 and 420 nm, or blue light-emitting elements having a wavelength of between 420 and 470 nm are preferable.

[LED Chips]

Because the light source devices 1, 11, 111, 112, and 113 of the present invention have structures in which an LED chip is used for the emission light source, it is possible to reduce the device size, and limit power consumption. Moreover, these light source devices can be treated cheaply and in large volumes.

Moreover, because this structure contains the phosphor of the present invention, using the blue light emitted by the LED as an excitation light source, it is possible to raise the emission intensity in wavelength regions where the emission intensity is generally low, and increase the color rendering of white emissions. In particular, it is possible to create an LED light-emitting device having a color rendering of 70 or more.

When an LED chip is used as the emission light source, then a gallium nitride-based compound semiconductor is preferably used from the standpoint of emission efficiency.

LED chips are obtained by forming a nitride-based compound semiconductor on a substrate via an MOCVD process or an HVPE process or the like, and preferably $In_\alpha Al_\beta Ga_{1-\alpha-\beta}N$ (wherein $0 \leq \alpha$, $0 \leq \beta$, $\alpha+\beta \leq 1$) is formed as the light-emitting layer. Examples of the structure of the semiconductor include homostructures, heterostructures, and double heterostructures having MIS junction, PIN junction, and pn junction and the like. Depending on the material forming the semiconductor layer and the mixed crystallinity thereof, various emission wavelengths can be selected. Moreover, the semiconductor active layer may also be a single quantum well structure or a multiple quantum well structure which is formed on a thin film which generates a quantum effect.

The gallium nitride-based compound semiconductor that is used as the LED chip has an extremely high refractive index of approximately 2.4 to 2.5.

Because of this, when a gallium nitride-based compound semiconductor is used as the emission light source, a resin that has a high refractive index is required. It is preferable from this standpoint as well for the first resin that contains the phosphor to be a resin that has a high refractive index. In contrast, in order to increase the extraction efficiency of light from a light-emitting element, it is preferable for a resin that has a lower refractive index than the first resin to be used for the second resin which is placed on the outside of the first resin.

[EL Element]

It is also the case that when an EL element is used as the emission light source, then provided that the EL element is able to emit light in an emission spectrum of between 330 nm and 470 nm, there are no limits on the type of EL element that is used, and either an inorganic or an organic EL element may be used.

If the EL element is an inorganic EL element, then it does not matter whether the EL element is a thin-film type, a distributed type, a dc drive type, or an ac drive type. Neither are there any particular limitations on the phosphor contained within the EL element, however, a sulfide-based phosphor is preferably used.

If the EL element is an organic EL element, then it does not matter whether the EL element is a laminated type, a doped type, a low molecular type, or a polymer type.

In addition to a method in which the phosphor of the present invention is used singly in the light-emitting devices 1, 11, 111, 112, and 113 of the present invention, by using it in combination with phosphors having other emission characteristics, it is possible to construct a light-emitting device that emits light of a desired color.

An example of this is a combination of an ultraviolet LED light-emitting element having a wavelength range of between 330 and 420 nm, a blue phosphor that is excited by this wavelength and that has an emission peak in a wavelength range of between 420 nm and 480 nm, the phosphor of the present invention whose emission color has been adjusted to green, and a red phosphor. Examples of the blue phosphor include $BaMgAl_{10}O_{17}$:Eu, and examples of the red phosphor include $CaAlSiN_3$:Eu and the like. In this structure, if the ultraviolet rays emitted by the LED are irradiated onto the respective phosphors, then blue-colored light, green-colored light, and red-colored light are simultaneously emitted, and these lights are mixed together so that a white light-emitting device is formed.

Moreover, in the light-emitting devices 1, 11, 111, 112, and 113 of the present invention, by combining together an ultraviolet LED light-emitting element having a wavelength range of between 330 and 420 nm, a blue phosphor such as $BaMgAl_{10}O_{17}$:Eu, the phosphor of the present invention whose emission color has been adjusted to blue-green, a green phosphor such as the phosphor of the present invention whose emission color has been adjusted to green or a β-sialon phosphor, a yellow phosphor such as α-sialon, and a red phosphor such as $CaAlSiN_3$:Eu and the like, it is possible to create a light-emitting device having an extremely high level of color rendering.

Moreover, the light-emitting devices 1, 11, 111, 112, and 113 of the present invention are light-emitting devices that are formed by a blue LED light-emitting element having a wavelength range of between 420 and 470 nm, and a phosphor, and by combining together the phosphor of the present invention whose emission color has been adjusted to green and a red phosphor such as $CaAlSiN_3$:Eu and the like, it is possible to create a white light-emitting device.

Moreover, in the light-emitting devices 1, 11, 111, 112, and 113 of the present invention, by combining together a blue LED light-emitting element having a wavelength range of between 420 and 470 nm, the phosphor of the present invention whose emission color has been adjusted to blue-green, a green phosphor such as the phosphor of the present invention whose emission color has been adjusted to green, a β-sialon phosphor, or $Ca_3Sc_2Si_3O_{12}$:Ce, a yellow phosphor such as α-sialon and YAG:Ce, and a red phosphor such as $CaAlSiN_3$:Eu and the like, it is possible to create a light-emitting device having an extremely high level of color rendering.

Furthermore, because the light-emitting devices 1, 11, 111, 112, and 113 of the present invention have a structure that allows a phosphor that is capable of being excited by ultraviolet light, and an excitation light source in the form of an LED whose emission wavelength maximum intensity is in a range of between 380 and 410 nm to be provided as their component elements, it is possible to create a colored LED device that only perceives the light emitted by the phosphor as a color.

It is possible to produce, for example, blue, blue-green, and green LED. In addition, in addition to the fact that the emission characteristics of the phosphor of the present invention tend to be unaffected by temperature, a colored LED that utilizes light emissions from this type of phosphor is superior in that it shows no sign of any shift in wavelength that is due to the current value, which has been a problem in green LED, in particular.

[Form of the Light-Emitting Device]

When an LED chip is used as a light source in the light-emitting devices 1, 11, 111, 112, and 113 of the present invention, the form of the light-emitting device is generally either a molded type LED device or a surface-mounted LED device. Because standards have been established for devices having these forms and they are widely used, they can easily be put to use in industry.

Furthermore, the form of the light-emitting device may also be a chip-on-board form in which the LED chip is directly mounted onto a wired substrate. In this case, a customized form that is optimized to the application can be created, and the light-emitting device can be used in applications that make full use of the characteristics of the present phosphor which has excellent temperature characteristics.

[Resin Component]

In the light-emitting devices 1, 11, 111, 112, and 113 of the present invention, out of the resin components making up the LED device, it is desirable for at least the substrate and/or reflector portion to contain components made of resin or ceramic.

Resin components are preferred as they can be manufactured cheaply and in large quantities. The type of resin that is used desirably has high heat-resistance and high reflectance, and nylon resins and the like are desirable. Thermosetting resins are preferred because they have high heat-resistance and can be manufactured comparatively cheaply and in large quantities. Ceramic components are also desirable as they have extremely excellent heat-resistance.

[Sealing Resin]

The light-emitting devices 1, 11, 111, 112, and 113 of the present invention may also have a structure in which the phosphor is dispersed in a sealing resin which is formed so as to completely enclose the LED chip. By employing this type of structure, it is possible to simplify the manufacturing of the light-emitting device.

Moreover, it is desirable for the LED chip sealing resin to contain silicone resin in at least a portion of the area thereof. Because silicone resin possesses resistance against short wavelength light, it is favorable for sealing a short wavelength LED chip. Furthermore, by using methyl silicone resin which has flexibility as the resin, it is possible to avoid breakages of the bonding wire. It is also possible to use phenyl silicone which has rigidity as the resin. In this case, dampness and the like are prevented from penetrating into the chip so that this type of resin is preferable when the chip is used in difficult environments having high humidity levels.

[Phosphor Dispersion Method]

In the light-emitting devices 1, 11, 111, 112, and 113 of the present invention, it is desirable for the phosphor to be densely dispersed in the vicinity of the LED chip. By positioning the phosphor in the vicinity of the LED chip, excitation light can be efficiently introduced into the phosphor.

Moreover, compared with other phosphors, because the phosphor of the present invention exhibits few changes in the characteristics thereof due to the temperature, if the phosphor is positioned in the vicinity of the LED chip so that it receives heat generated from the LED chip and the temperature of the phosphor rises, there is still only a slight change in the characteristics of the phosphor.

The method employed to position the phosphor in the vicinity of the LED chip may be one in which the vicinity of the LED chip is sealed with a first resin (i.e., a sealing resin) which contains the phosphor, and the outer circumference thereof is then sealed with a second resin (i.e., another sealing resin). This method is desirable as it can be implemented cheaply. It is desirable for the first resin to contain silicone resin having high heat-resistance.

In the same way, the method employed to position the phosphor in the vicinity of the LED chip may also be one in which the phosphor is adhered directly to the LED chip. For example, the phosphor can be adhered directly such that it covers at least one surface of the LED chip. Using a spin-coating method, vapor deposition, or a sputtering method or the like, the phosphor can be accumulated as a layer from the wafer stage on at least one surface of the LED chip. These methods are preferable as they make it possible to control and uniformize the phosphor layer. In this case, by making the thickness of the phosphor layer between 1 μm and 100 μm, light from the LED chip can pass through the phosphor layer and be extracted, which is desirable when colors are to be mixed to create white light.

In the light-emitting devices 1, 11, 111, 112, and 113 of the present invention, because the temperature characteristics of the phosphor that is used are excellent, they are desirably used in applications in which a large quantity of heat is generated. For example, they are desirable when the LED device is used in applications in which 0.2 W or more of power is supplied to each package. Furthermore, they are also desirable when the LED chips contained in the LED device are used in applications in which, in terms of surface area power density per individual package, $1.5 \times 10^4$ W/m$^2$ of power is supplied thereto. They are even more desirable when, in terms of surface area power density per individual package, $5 \times 10^4$ W/m$^2$ of power is supplied thereto.

Moreover, generally, cases in which an LED device is used in applications in which a large quantity of power is supplied can be assumed to be cases in which the LED chips contained in the LED device are larger than an area of a square whose sides are 350 μm long, cases in which a plurality of LED chips are contained in the LED device, and cases in which the LED chip is a flip chip.

Because the light-emitting devices 1, 11, 111, 112, and 113 of the present invention have a structure in which they can be excited by ultraviolet light, it is possible to create a white LED by mixing together the light emissions from several types of phosphor. Accordingly, although it is possible by using the phosphor of the present invention to develop either one of or both of blue and green colors, it is necessary, in this case, to also include a phosphor that displays a red color in addition to these. The white color that is formed by the mixing together of these three colors is able to provide excellent color rendering.

Moreover, it is also possible for only the green to be provided by the phosphor of the present invention, and for the excitation light and the blue color development to be provided by the light emission from the LED.

Furthermore, because the structure is one that is able to contain two or more types of phosphor of the present invention that have mutually different compositions, the emitted spectrum can be made a continuous spectrum emission having superior color rendering.

Furthermore, by including a group of phosphors whose composition changes in gradated stages, it is also possible to form a desired continuous spectrum. In addition, if the half width of the synthesized emission spectrum is set to 100 nm or more, then superior color rendering can be achieved.

Hereinafter, the present invention will be described in detail based on examples. It should, however, be noted that the present invention is not limited to these examples.

EXAMPLES

Examples 1 to 7

Firstly, a method of manufacturing the phosphors of Examples 1 to 7 will be described.

For the raw material powders, silicon nitride powder ($Si_3N_4$) having a mean particle diameter of 0.5 μm, an oxygen content of 0.93% by mass, and an α-type concentration of 92%, aluminum nitride powder (AlN), $SrSi_2$ powder, strontium oxide powder (SrO), and europium oxide powder ($Eu_2O_3$) were used.

The above raw material powders were weighed in the blend proportions (i.e., mass ratios; the same applies in the other examples described below) shown in Table 2 such that the values of m, n, s, and x shown in Table 1 were obtained in the general formula $(A_{1-x}R_x)_m Si_{6n-5m-s} Al_{7m-4n+s} O_s N_{m+4n-s}$, and were then mixed using an agate mortar and pestle for 30 minutes. Note that Eu was used for R.

TABLE 1

|  |  | m | n | s | x |
|---|---|---|---|---|---|
| Example | 1 | 18 | 29 | 7.2 | 0.02 |
| Example | 2 | 13 | 21 | 5.2 | 0.02 |
| Example | 3 | 21 | 34 | 8.4 | 0.02 |
| Example | 4 | 8 | 13 | 3.2 | 0.02 |
| Example | 5 | 19 | 31 | 7.6 | 0.02 |
| Example | 6 | 11 | 18 | 4.4 | 0.02 |
| Example | 7 | 14 | 23 | 5.6 | 0.02 |

TABLE 2

|  | $SrSi_2$ (g) | SrO (g) | $Si_3N_4$ (g) | AlN (g) | $Eu_2O_3$ (g) | Emission intensity (count) | Emission wavelength (nm) |
|---|---|---|---|---|---|---|---|
| Ex. 1 | 2.768 | 1.263 | 4.600 | 1.256 | 0.113 | 87 | 504 |
| Ex. 2 | 2.763 | 1.261 | 4.631 | 1.232 | 0.113 | 90 | 503 |
| Ex. 3 | 2.759 | 1.259 | 4.658 | 1.211 | 0.113 | 92 | 503 |
| Ex. 4 | 2.753 | 1.257 | 4.701 | 1.177 | 0.112 | 95 | 502 |
| Ex. 5 | 2.747 | 1.254 | 4.748 | 1.140 | 0.112 | 99 | 506 |
| Ex. 6 | 2.742 | 1.251 | 4.782 | 1.113 | 0.112 | 102 | 504 |
| Ex. 7 | 2.735 | 1.248 | 4.828 | 1.077 | 0.112 | 93 | 503 |

The blended powders thus obtained were placed in an aluminum mold, and molded objects having a bulk density of approximately 25% were prepared. These were then loaded into crucibles made of boron nitride (hBN). The ratio of the volume of the molded objects to the volume of the crucibles was approximately 80%.

The boron nitride crucibles that were loaded with the blended powders were then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired objects (i.e., the fired lump) were coarsely pulverized, and were then manually pulverized using a mortar made from a silicon nitride sintered compact. Using a sieve having a mesh of 30 µm, the resulting powders were then classified so as to provide phosphor powders having a mean particle diameter of 11 µm (Examples 1 to 7).

Next, the emission spectrums and excitation spectrums of these phosphor powders (i.e., Examples 1 to 7) were measured using a fluorospectrophotometer.

Figure 6:
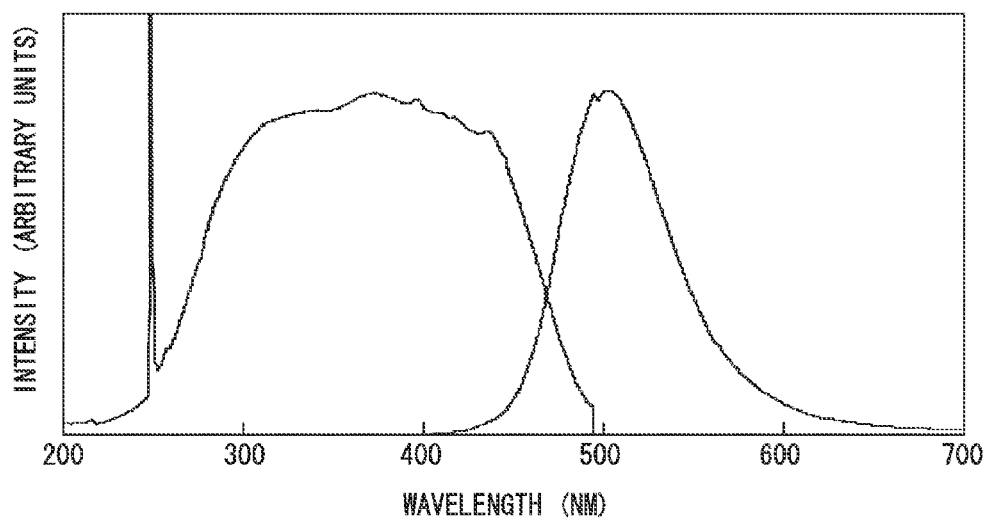
FIG. 6 is a view showing a light emission and excitation spectrum of a phosphor of Example 6 of the present invention.

FIG. 6 shows the measurement results for the emission spectrum and excitation spectrum of the phosphor of Example 6. As is shown in FIG. 6, the peak wavelength of the excitation spectrum of the phosphor of Example 6 was 370 nm, and the peak wavelength of the emission spectrum created by blue light excitation at a wavelength of 450 nm was 504 nm. The emission intensity of the peak wavelength had a count of 100.

The emission wavelength and emission intensity of the emission peaks of these phosphor powders (Examples 1 to 7) are shown in Table 2. Note that the count values of the emission intensities are arbitrary units and change depending measurement apparatus and conditions (the same applies below).

Figure 7:
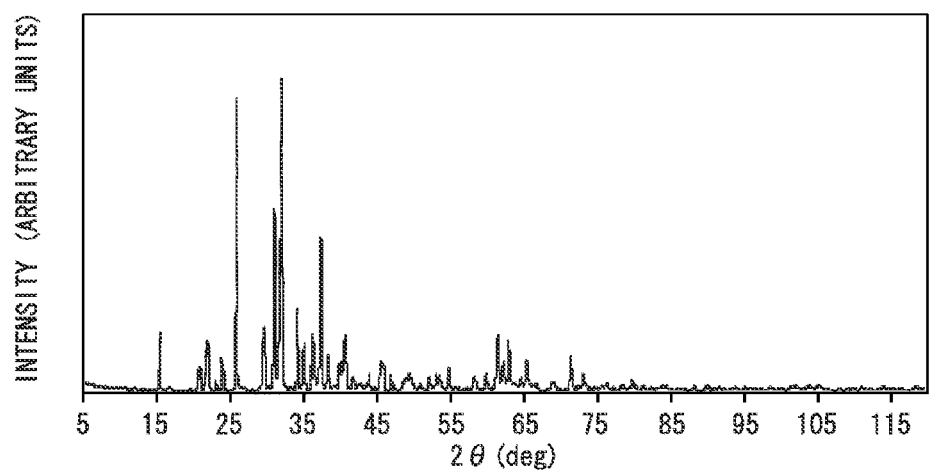
FIG. 7 is a view showing a powder X-ray diffraction chart for the phosphor of Example 6 of the present invention.

FIG. 7 shows the measurement results of the powder X-ray diffraction pattern for the phosphor of Example 6. As is shown in FIG. 7, a powder X-ray diffraction pattern formed by main diffraction peaks was obtained.

In the same way as in Example 6, in the phosphors of Examples 1 to 5 and Example 7, powder X-ray diffraction patterns formed by main diffraction peaks were obtained.

When these phosphor powders (i.e., of Examples 1 to 7) were exposed for 100 hours to conditions of 80% humidity and 80° C., there was essentially no sign of any decrease in luminance.

Next, these phosphor powders (i.e., of Examples 1 to 7) were observed using an optical microscope while ultraviolet rays having a wavelength of 365 nm were irradiated thereon when this was deemed necessary.

From the color of the test samples, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_n N_{(32-n)}$ (n~1), and $SrSi_6N_8$, or a crystalline phase that shows a different light emission from blue-green in the vicinity of 504 nm was not more than 20% by volumetric ratio.

Examples 8 to 14

Examples 8 to 14 of the phosphors of the present invention will now be described.

For the raw material powders silicon nitride powder ($Si_3N_4$) having a mean particle diameter of 0.5 µm, an oxygen content of 0.93% by mass, and an β-type concentration of 92%, aluminum nitride powder (AlN), $SrSi_2$ powder, strontium oxide powder (SrO), and europium oxide powder ($Eu_2O_3$) were used.

The above raw material powders were weighed in the blend proportions (i.e., mass ratios; the same applies in the other examples described below) shown in Table 4 such that the values of m, n, s, and x shown in Table 3 were obtained in the general formula $(A_{1-x}R_x)_m Si_{6n-5m-s} Al_{7m-4n+s} O_s N_{m+4n-s}$, and were then mixed using an agate mortar and pestle for 30 minutes. Note that Eu was used for R.

TABLE 3

|  |  | m | n | s | x |
|---|---|---|---|---|---|
| Example | 8 | 11 | 18 | 4.4 | 0.01 |
| Example | 9 | 11 | 18 | 4.4 | 0.02 |
| Example | 10 | 11 | 18 | 4.4 | 0.03 |
| Example | 11 | 11 | 18 | 4.4 | 0.05 |
| Example | 12 | 11 | 18 | 4.4 | 0.10 |
| Example | 13 | 11 | 18 | 4.4 | 0.15 |
| Example | 14 | 11 | 18 | 4.4 | 0.20 |

TABLE 4

|  | $SrSi_2$ (g) | SrO (g) | $Si_3N_4$ (g) | AlN (g) | $Eu_2O_3$ (g) | Emission intensity (count) | Emission wavelength (nm) |
|---|---|---|---|---|---|---|---|
| Ex. 8 | 2.748 | 1.287 | 4.793 | 1.116 | 0.056 | 81 | 496 |
| Ex. 9 | 2.742 | 1.251 | 4.782 | 1.113 | 0.112 | 101 | 497 |
| Ex. 10 | 2.735 | 1.216 | 4.771 | 1.111 | 0.167 | 102 | 504 |
| Ex. 11 | 2.723 | 1.145 | 4.749 | 1.105 | 0.278 | 100 | 508 |
| Ex. 12 | 2.748 | 1.287 | 4.793 | 1.116 | 0.056 | 99 | 511 |
| Ex. 13 | 2.745 | 1.269 | 4.788 | 1.114 | 0.084 | 95 | 518 |
| Ex. 14 | 2.742 | 1.251 | 4.782 | 1.113 | 0.112 | 92 | 522 |

The blended powders thus obtained were placed in an aluminum mold, and molded objects having a bulk density of approximately 26% were prepared. These were then loaded into crucibles made of boron nitride. The ratio of the volume of the molded objects to the volume of the crucibles was approximately 80%.

The boron nitride crucibles that were loaded with the blended powder were then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired objects were coarsely pulverized, and were then manually pulverized using a mortar made from a silicon nitride sintered compact. Using a sieve having a mesh of 30 μm, the resulting powders were then classified so as to provide phosphor powders having a mean particle diameter of 12 μm (Examples 8 to 14).

Firstly, the emission spectrums and excitation spectrums of these phosphor powders (i.e., Examples 8 to 14) were measured using a fluorospectrophotometer.

Figure 8:
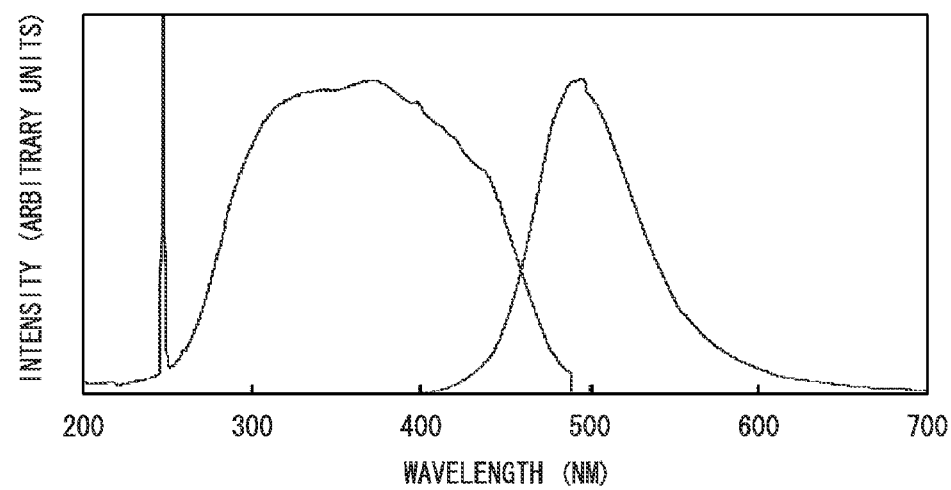
FIG. 8 is a view showing a light emission spectrum and an excitation spectrum of a phosphor of Example 8 of the present invention.

FIG. 8 shows the measurement results for the emission spectrum and excitation spectrum of the phosphor of Example 8. As is shown in FIG. 8, the peak wavelength of the excitation spectrum of the phosphor of Example 8 was 366 nm, and the peak wavelength of the emission spectrum was 496 nm.

Figure 9:
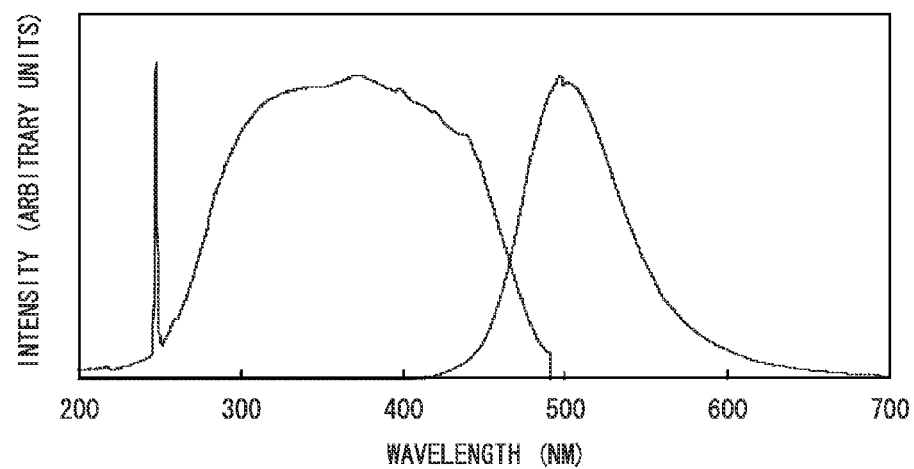
FIG. 9 is a view showing a light emission spectrum and an excitation spectrum of a phosphor of Example 9 of the present invention.

FIG. 9 shows the measurement results for the emission spectrum and excitation spectrum of the phosphor of Example 9. As is shown in FIG. 9, the peak wavelength of the excitation spectrum of the phosphor of Example 9 was 372 nm, and the peak wavelength of the emission spectrum was 497 nm.

Figure 10:
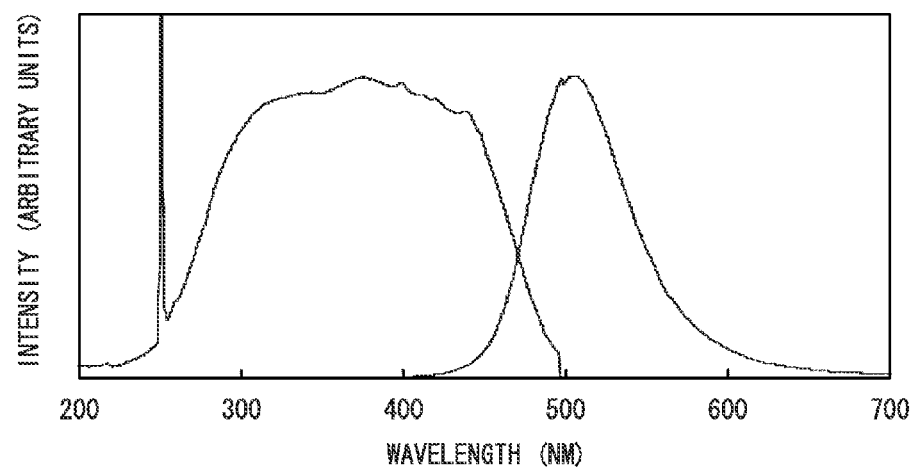
FIG. 10 is a view showing a light emission spectrum and an excitation spectrum of a phosphor of Example 10 of the present invention.

FIG. 10 shows the measurement results for the emission spectrum and excitation spectrum of the phosphor of Example 10. As is shown in FIG. 10, the peak wavelength of the excitation spectrum of the phosphor of Example 10 was 379 nm, and the peak wavelength of the emission spectrum was 504 nm.

Figure 11:
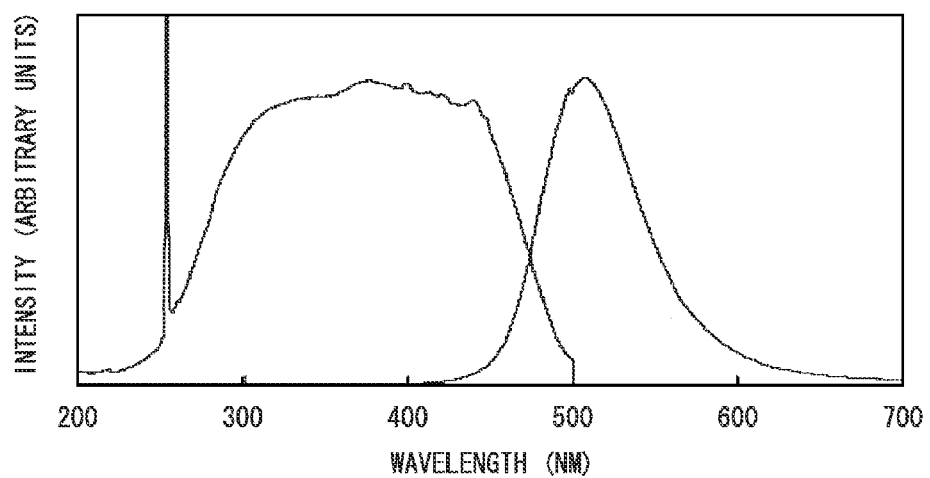
FIG. 11 is a view showing a light emission spectrum and an excitation spectrum of a phosphor of Example 11 of the present invention.

FIG. 11 shows the measurement results for the emission spectrum and excitation spectrum of the phosphor of Example 11. As is shown in FIG. 11, the peak wavelength of the excitation spectrum of the phosphor of Example 11 was 375 nm, and the peak wavelength of the emission spectrum was 508 nm.

Figure 12:
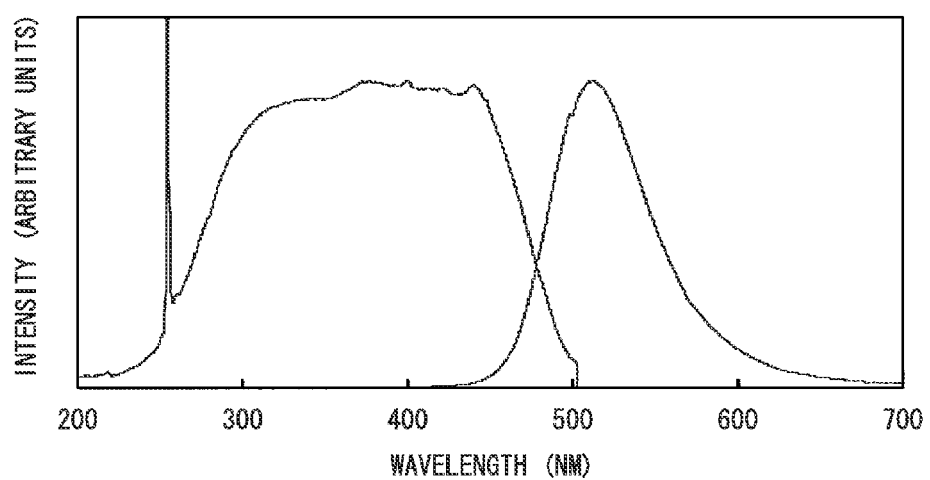
FIG. 12 is a view showing a light emission spectrum and an excitation spectrum of a phosphor of Example 12 of the present invention.

FIG. 12 shows the measurement results for the emission spectrum and excitation spectrum of the phosphor of Example 12. As is shown in FIG. 12, the peak wavelength of the excitation spectrum of the phosphor of Example 12 was 397 nm, and the peak wavelength of the emission spectrum was 511 nm.

Figure 13:
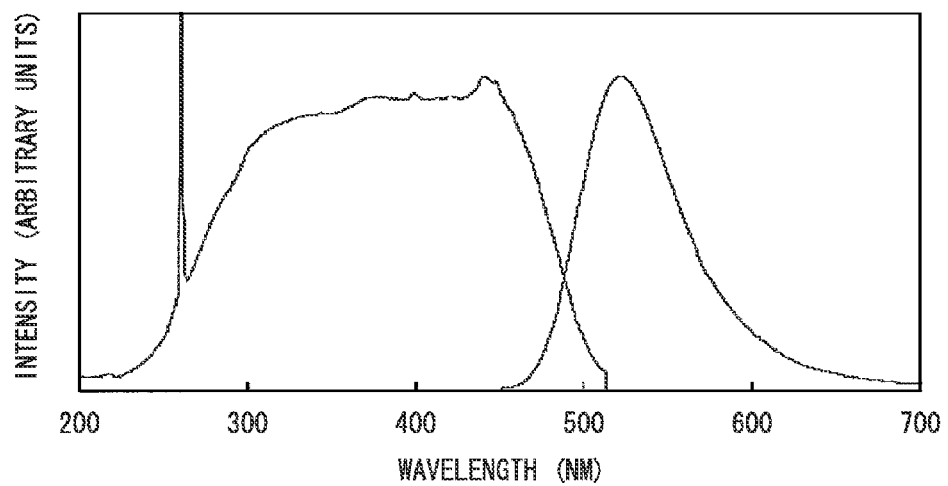
FIG. 13 is a view showing a light emission spectrum and an excitation spectrum of a phosphor of Example 13 of the present invention.

FIG. 13 shows the measurement results for the emission spectrum and excitation spectrum of the phosphor of Example 13. As is shown in FIG. 13, the peak wavelength of the excitation spectrum of the phosphor of Example 13 was 411 nm, and the peak wavelength of the emission spectrum was 518 nm.

Figure 14:
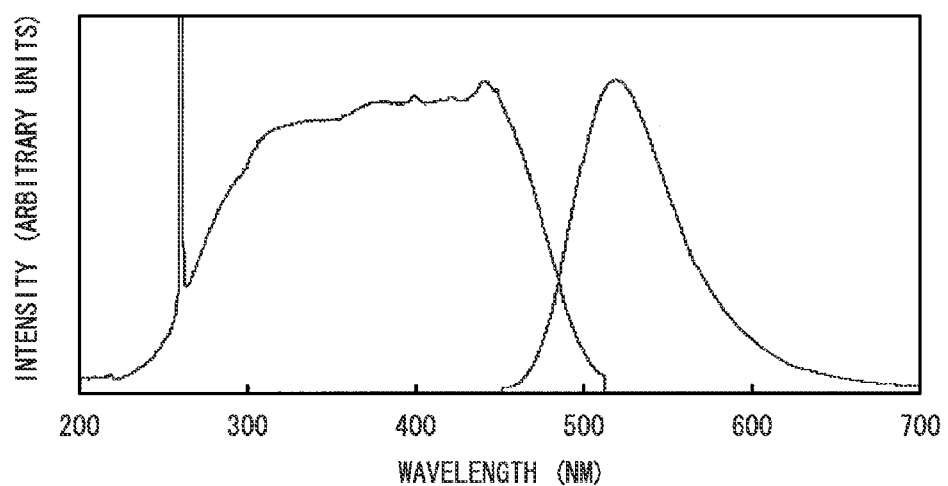
FIG. 14 is a view showing a light emission spectrum and an excitation spectrum of a phosphor of Example 14 of the present invention.

FIG. 14 shows the measurement results for the emission spectrum and excitation spectrum of the phosphor of Example 14. As is shown in FIG. 14, the peak wavelength of the excitation spectrum of the phosphor of Example 14 was 440 nm, and the peak wavelength of the emission spectrum was 522 nm.

The emission wavelength and emission intensity of the emission peaks of these phosphor powders (Examples 8 to 14) are shown in Table 4. Note that the count values of the emission intensities are arbitrary units.

When these phosphor powders (i.e., of Examples 8 to 14) were exposed for 100 hours to conditions of 80% humidity and 80° C., there was essentially no sign of any decrease in luminance.

Next, these phosphor powders (i.e., of Examples 8 to 14) were observed using an optical microscope while ultraviolet rays having a wavelength of 365 nm were irradiated thereon when this was deemed necessary.

From the color of the test samples, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, $SrSiAl_7N_2O_3$, $Sr_2Al_2Si_{10}N_{14}O_4$, $SrSi_{(10-n)}Al_{(18+n)}O_nN_{(32-n)}$ (n~1), and $SrSi_6N_8$, or a crystalline phase that shows a different light emission from blue-green in the vicinity of 500 to 520 nm was not more than 20% by volumetric ratio.

Examples 15 to 21

Examples 15 to 21 of the phosphors of the present invention will now be described.

For the raw material powders, silicon nitride powder ($Si_3N_4$) having a mean particle diameter of 0.5 μm, an oxygen content of 0.93% by mass, and an α-type concentration of 92%, aluminum nitride powder (AlN), $SrSi_2$ powder, strontium oxide powder (SrO), and europium oxide powder ($Eu_2O_3$) were used.

The above raw material powders were weighed in the blend proportions (i.e., mass ratios; the same applies in the other examples described below) shown in Table 6 such that the values of m, n, s, and x shown in Table 5 were obtained in the general formula $(A_{1-x}R_x)_mSi_{6n-5m-s}Al_{7m-4n+s}O_sN_{m+4n-s}$, and were then mixed using an agate mortar and pestle for 30 minutes. Note that Eu was used for R.

TABLE 5

|  |  | m | n | s | x |
|---|---|---|---|---|---|
| Example | 15 | 11 | 18 | 0.22 | 0.02 |
| Example | 16 | 11 | 18 | 1.1 | 0.02 |
| Example | 17 | 11 | 18 | 2.2 | 0.02 |
| Example | 18 | 11 | 18 | 3.3 | 0.02 |
| Example | 19 | 11 | 18 | 5.5 | 0.02 |
| Example | 20 | 11 | 18 | 7.7 | 0.02 |
| Example | 21 | 11 | 18 | 11.0 | 0.02 |

TABLE 6

|  | SrSi$_2$ (g) | SrO (g) | Si$_3$N$_4$ (g) | AlN (g) | Eu$_2$O$_3$ (g) | Emission intensity (count) | Emission wavelength (nm) |
|---|---|---|---|---|---|---|---|
| Ex. 15 | 4.751 | 0.000 | 4.475 | 0.656 | 0.119 | 98 | 500 |
| Ex. 16 | 4.308 | 0.276 | 4.542 | 0.757 | 0.117 | 98 | 502 |
| Ex. 17 | 3.770 | 0.611 | 4.625 | 0.879 | 0.115 | 100 | 503 |
| Ex. 18 | 3.248 | 0.936 | 4.705 | 0.998 | 0.114 | 101 | 505 |
| Ex. 19 | 2.251 | 1.557 | 4.857 | 1.225 | 0.110 | 102 | 505 |
| Ex. 20 | 1.311 | 2.142 | 5.001 | 1.439 | 0.107 | 102 | 507 |
| Ex. 21 | 0.000 | 2.959 | 5.202 | 1.737 | 0.103 | 103 | 507 |

The blended powders thus obtained were placed in an aluminum mold, and molded objects having a bulk density of approximately 24% were prepared. These were then loaded into crucibles made of boron nitride. The ratio of the volume of the molded objects to the volume of the crucibles was approximately 80%.

The boron nitride crucibles that were loaded with the blended powder were then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired objects were coarsely pulverized, and were then manually pulverized using a mortar made from a silicon nitride sintered compact. Using a sieve having a mesh of 30 μm, the resulting powders were then classified so as to provide phosphor powders having a mean particle diameter of 12 μm (Examples 15 to 21).

Firstly, the emission spectrums and excitation spectrums of these phosphor powders (i.e., Examples 15 to 21) were measured using a fluorospectrophotometer.

The peak wavelengths of the excitation spectrums of each phosphor were in the vicinity of 370 nm, and light emission ranging from a blue-green color through to a green color was displayed by the excitation of blue light having a wavelength of 450 nm. The emission wavelength and emission intensity of the emission peaks of these phosphor powders (Examples 15 to 21) are shown in Table 6. Note that the count values of the emission intensities are arbitrary units.

When these phosphor powders (i.e., of Examples 15 to 21) were exposed for 100 hours to conditions of 80% humidity and 80° C., there was essentially no sign of any decrease in luminance.

Next, these phosphor powders (i.e., of Examples 15 to 21) were observed using an optical microscope while ultraviolet rays having a wavelength of 365 nm were irradiated thereon when this was deemed necessary.

From the color of the test samples, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$(n~1), and SrSi$_6$N$_8$, or a crystalline phase that shows a different light emission from blue-green in the vicinity of 504 nm was no more than 20% by volumetric ratio.

Example 22

Example 22 of the phosphor of the present invention will now be described. For the raw material powder, silicon nitride powder (Si$_3$N$_4$) having a mean particle diameter of 0.5 μm, an oxygen content of 0.93% by mass, and an α-type concentration of 92%, aluminum nitride powder (AlN), aluminum oxide powder (Al$_2$O$_3$), Sr$_2$Si$_5$N$_8$ powder, and Eu$_2$Si$_5$N$_8$ powder were used.

The above raw material powder was weighed in the blend proportion (i.e., mass ratio; the same applies in the other examples described below) shown in Table 8 such that the values of m, n, s, and x shown in Table 7 were obtained in the general formula (A$_{1-x}$R$_x$)$_m$Si$_{6n-5m-s}$Al$_{7m-4n+s}$O$_s$N$_{m+4n-s}$, and was then mixed using an agate mortar and pestle for 30 minutes. Note that Eu was used for R.

TABLE 7

|  | m | n | s | x |
|---|---|---|---|---|
| Example 22 | 11 | 18 | 4.4 | 0.02 |

TABLE 8

|  | Sr$_2$Si$_5$N$_8$ (g) | Si$_3$N$_4$ (g) | AlN (g) | Al$_2$O$_3$ (g) | Eu$_2$Si$_5$N$_8$ (g) | Emission intensity (count) | Emission wavelength (nm) |
|---|---|---|---|---|---|---|---|
| Ex. 22 | 6.119 | 2.618 | 0.703 | 0.397 | 0.162 | 112 | 505 |

The blended powder thus obtained was placed in an aluminum mold, and a molded object having a bulk density of approximately 25% was prepared. This was then loaded into a crucible made of boron nitride. The ratio of the volume of the molded object to the volume of the crucible was approximately 80%. Note that each one of the respective steps, namely, the weighing of the powder, the blending, and the molding were performed in air.

The boron nitride crucible that was loaded with the blended powder was then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 12 μm.

Firstly, the emission spectrum and excitation spectrum of this phosphor powder (i.e., Example 22) were measured using a fluorospectrophotometer.

The peak wavelength of the excitation spectrum of the phosphor was 370 nm, and a blue-green color light emission was displayed by the excitation of blue light having a wavelength of 450 nm. The emission wavelength and emission intensity of the emission peak of this phosphor powder (Example 22) are shown in Table 8. Note that the count value of the emission intensity is an arbitrary unit.

When this phosphor powder (i.e., Example 22) was exposed for 100 hours to conditions of 80% humidity and 80° C., there was essentially no sign of any decrease in luminance.

Next, this phosphor powder (i.e., Example 22) was observed using an optical microscope while ultraviolet rays having a wavelength of 365 nm were irradiated thereon when this was deemed necessary.

From the color of the test sample, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1), and $SrSi_6N_8$, or a crystalline phase that shows a different light emission from blue-green in the vicinity of 504 nm was no more than 20% by volumetric ratio.

Example 23

Example 23 of the phosphor of the present invention will now be described. For the raw material powder, silicon nitride powder ($Si_3N_4$) having a mean particle diameter of 0.5 μm, an oxygen content of 0.93% by mass, and an α-type concentration of 92%, aluminum nitride powder (AlN), $CaSi_2$ powder, calcium oxide powder (CaO), and europium oxide powder ($Eu_2O_3$) was used.

The above raw material powder was weighed in the blend proportion (i.e., mass ratio; the same applies in the other examples described below) shown in Table 10 such that the values of m, n, s, and x shown in Table 9 were obtained in the general formula $(A_{1-x}R_x)_mSi_{6n-5m-s}Al_{7m-4n+s}O_sN_{m+4n-s}$, and was then mixed using an agate mortar and pestle for 30 minutes. Note that Eu was used for R.

TABLE 9

| | m | n | s | x |
|---|---|---|---|---|
| Example 23 | 11 | 18 | 4.4 | 0.02 |

TABLE 10

| | $CaSi_2$ (g) | CaO (g) | $Si_3N_4$ (g) | AlN (g) | $Eu_2O_3$ (g) | Emission intensity (count) | Emission wavelength (nm) |
|---|---|---|---|---|---|---|---|
| Ex. 23 | 2.154 | 0.795 | 5.613 | 1.307 | 0.131 | 91 | 547 |

The blended powder thus obtained was placed in an aluminum mold, and a molded object having a bulk density of approximately 23% was prepared. This was then loaded into a crucible made of boron nitride. The ratio of the volume of the molded object to the volume of the crucible was approximately 80%. Note that each one of the respective steps, namely, the weighing of the powder, the blending, and the molding were performed in air.

The boron nitride crucible that was loaded with the blended powder was then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 11 μm (Example 23).

Firstly, the emission spectrum and excitation spectrum of this phosphor powder (i.e., Example 23) were measured using a fluorospectrophotometer.

The peak wavelength of the excitation spectrum of this phosphor was in the vicinity of 380 nm, and light emission ranging from a green color through to a yellow-green color was displayed by the excitation of blue light having a wavelength of 450 nm. The emission wavelength and emission intensity of the emission peak of this phosphor powder (Example 23) are shown in Table 10. Note that the count value of the emission intensity is an arbitrary unit.

When this phosphor powder (i.e., Example 23) was exposed for 100 hours to conditions of 80% humidity and 80° C., there was essentially no sign of any decrease in luminance.

Next, this phosphor powder (i.e., Example 23) was observed using an optical microscope while ultraviolet rays having a wavelength of 365 nm were irradiated thereon when this was deemed necessary.

From the color of the test samples, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1), and $SrSi_6N_8$, or a crystalline phase that shows a different light emission from green through yellow-green in the vicinity of 550 nm was no more than 20% by volumetric ratio.

Example 24

Example 24 of the phosphor of the present invention will now be described. For the raw material powder, silicon nitride powder ($Si_3N_4$) having a mean particle diameter of 0.5 μm, an oxygen content of 0.93% by mass, and an α-type concentration of 92%, aluminum nitride powder (AlN), $BaSi_2$ powder, barium oxide powder (BaO), and europium oxide powder ($Eu_2O_3$) were used.

The above raw material powder was weighed in the blend proportion (i.e., mass ratio; the same applies in the other examples described below) shown in Table 12 such that the values of m, n, s, and x shown in Table 11 were obtained in the general formula $(A_{1-x}R_x)_mSi_{6n-5m-s}Al_{7m-4n+s}O_sN_{m+4n-s}$, and was then mixed using an agate mortar and pestle for 30 minutes. Note that Eu was used for R.

TABLE 11

| | m | n | s | x |
|---|---|---|---|---|
| Example 24 | 11 | 18 | 4.4 | 0.02 |

TABLE 12

| | BaSi$_2$ (g) | BaO (g) | Si$_3$N$_4$ (g) | AlN (g) | Eu$_2$O$_3$ (g) | Emission intensity (count) | Emission wavelength (nm) |
|---|---|---|---|---|---|---|---|
| Ex. 24 | 3.195 | 1.603 | 4.141 | 0.964 | 0.097 | 102 | 467 |

The blended powder thus obtained was placed in an aluminum mold, and a molded object having a bulk density of approximately 24% was prepared. This was then loaded into a crucible made of boron nitride. The ratio of the volume of the molded object to the volume of the crucible was approximately 80%. Note that each one of the respective steps, namely, the weighing of the powder, the blending, and the molding were performed in air.

The boron nitride crucible that was loaded with the blended powder was then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 12 μm (Example 24).

Firstly, the emission spectrum and excitation spectrum of this phosphor powder (i.e., Example 24) were measured using a fluorospectrophotometer.

The peak wavelength of the excitation spectrum of the phosphor was in the vicinity of 360 nm, and a green-blue color light emission was displayed by the excitation of near-ultraviolet light having a wavelength of 400 nm. The emission wavelength and emission intensity of the emission peak of this phosphor powder (Example 24) are shown in Table 12. Note that the count value of the emission intensity is an arbitrary unit.

When this phosphor powder (i.e., Example 24) was exposed for 100 hours to conditions of 80% humidity and 80° C., there was essentially no sign of any decrease in luminance.

Next, this phosphor powder (i.e., Example 24) was observed using an optical microscope while ultraviolet rays having a wavelength of 365 nm were irradiated thereon when this was deemed necessary.

From the color of the test sample, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, SrSiAl$_2$N$_2$O$_3$, Sr$_2$Al$_2$Si$_{10}$N$_{14}$O$_4$, SrSi$_{(10-n)}$Al$_{(18+n)}$O$_n$N$_{(32-n)}$(n~1), and SrSi$_6$N$_8$, or a crystalline phase that shows a different light emission from green-blue in the vicinity of 470 nm was no more than 20% by volumetric ratio.

Example 25

Example 25 of the phosphor of the present invention will now be described. For the raw material powder, silicon nitride powder (Si$_3$N$_4$) having a mean particle diameter of 0.5 μm, an oxygen content of 0.93% by mass, and an α-type concentration of 92%, aluminum nitride powder (AlN), aluminum oxide powder (Al$_2$O$_3$), LaSi$_3$N$_5$ powder, and CeSi$_3$N$_5$ powder were used. The above raw material powder was weighed in the blend proportion (i.e., mass ratio; the same applies in the other examples described below) shown in Table 14 such that the values of m, n, s, and x shown in Table 13 were obtained in the general formula $(A_{1-x}R_x)_m Si_{6n-5m-s} Al_{7m-4n+s} O_s N_{m+4n-s}$, and was then mixed using an agate mortar and pestle for 30 minutes. Note that Ce was used for R.

TABLE 13

| | m | n | s | x |
|---|---|---|---|---|
| Example | 25 | 11 | 18 | 4.4 | 0.02 |

TABLE 14

| | LaSi$_3$N$_5$ (g) | Si$_3$N$_4$ (g) | AlN (g) | Al$_2$O$_3$ (g) | CeSi$_3$N$_5$ (g) | Emission intensity (count) | Emission wavelength (nm) |
|---|---|---|---|---|---|---|---|
| Ex. 25 | 5.432 | 2.969 | 1.231 | 0.257 | 0.111 | 98 | 458 |

The blended powder thus obtained was placed in an aluminum mold, and a molded object having a bulk density of approximately 23% was prepared. This was then loaded into a crucible made of boron nitride. The ratio of the volume of the molded object to the volume of the crucible was approximately 80%.

The boron nitride crucible that was loaded with the blended powder was then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 11 μm (Example 25).

Firstly, the emission spectrum and excitation spectrum of this phosphor powder (i.e., Example 25) were measured using a fluorospectrophotometer.

The peak wavelength of the excitation spectrum of the phosphor was 370 nm, and a blue color light emission was displayed by the excitation of near-ultraviolet light having a wavelength of 400 nm. The emission wavelength and emission intensity of the emission peak of this phosphor powder (Example 25) are shown in Table 14. Note that the count value of the emission intensity is an arbitrary unit.

When this phosphor powder (i.e., Example 25) was exposed for 100 hours to conditions of 80% humidity and 80° C., there was essentially no sign of any decrease in luminance.

Next, this phosphor powder (i.e., Example 25) was observed using an optical microscope while ultraviolet rays having a wavelength of 365 nm were irradiated thereon when this was deemed necessary.

From the color of the test sample, as well as from the particle shape and the color development when ultraviolet rays were irradiated thereon, it was confirmed that the proportion of a non-emission phase that was formed by one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$ (n~1), and $SrSi_6N_8$, or a crystalline phase that shows a different light emission from blue in the vicinity of 450 nm was no more than 20% as a volumetric ratio.

Examples 26 to 30

Fired lumps obtained in the same way as in Example 1 were pulverized using an agate mortar and pestle, and were then either classified using a sieve or by means of elutriation so as to prepare the phosphor powders having the desired mean particle diameters and mean aspect ratios shown in Table 15 (i.e., Examples 26 to 30).

10% by mass of the obtained phosphor powders (i.e., Examples 26 to 30) were then dispersed using a kneader in a silicone resin, and the emission intensity and dispersibility in the resin were then evaluated using a cross-section of this same resin. Note that the emission intensity is standardized with 100 as the maximum value. The dispersibility in resin is evaluated as the proportion of powder particles that have recognizable gaps at interfaces between the resin and the powder particles. The smaller the proportion of particles having recognizable gaps, the better the dispersibility.

TABLE 15

|  |  | Mean particle diameter (μm) | Mean aspect ratio | Emission intensity (count) | Gap proportion (%) |
|---|---|---|---|---|---|
| Example | 26 | 1.000 | 3.100 | 86.000 | 3.200 |
| Example | 27 | 6.000 | 5.100 | 99.000 | 2.200 |
| Example | 28 | 12.000 | 5.700 | 101.000 | 1.300 |
| Example | 29 | 22.000 | 13.400 | 95.000 | 3.300 |
| Example | 30 | 49.000 | 18.100 | 83.000 | 4.500 |

Examples 31 to 32

Other than adding lithium fluoride powder at a loss ratio of 0.5% by mass to the composition of Example 6, a phosphor powder (i.e., Example 31) which was prepared in the same way as in Example 1, and a phosphor powder (i.e., Example 32) that was prepared using a graphite crucible as the crucible were examined for their emission intensities, fluorine quantity, and boron quantity. Note that the emission intensities are determined with the emission intensity of Example 6 standardized as 100. Moreover, because silicon carbide was formed on the surface of the test sample which used the graphite crucible, the evaluation was conducted after the silicon carbide layer had been removed from this surface.

TABLE 16

|  |  | Crucible material | Fluorine quantity (ppm) | Boron quantity (ppm) | Emission intensity (count) |
|---|---|---|---|---|---|
| Example | 31 | hBN | 120.000 | 470.000 | 105.000 |
| Example | 32 | graphite | 107.000 | 0.000 | 89.000 |

Example 33

A powder obtained in the same way as in Example 6 was elutriated so that a phosphor powder having a mean particle diameter of 1.3 μm was obtained. This powder was then added as a seed at a loss ratio of 2% by mass to the composition of Example 6, so that a phosphor powder (i.e., Example 33) was synthesized in the same way as in Example 6.

When light having a wavelength of 365 nm was irradiated using an ultraviolet lamp onto this phosphor powder (i.e., Example 33), it was confirmed that light was being emitted in a blue-green color.

When the emission spectrum and excitation spectrum of the phosphor powder (i.e., Example 33) were measured using a fluorospectrophotometer, it was found that the peak wavelength in the excitation spectrum was 370 nm, and that the peak wavelength in the emission spectrum resulting from the excitation by blue color light having a wavelength of 450 nm was 504 nm (i.e., a blue-green color). If the emission intensity of Example 6 was standardized as 100, the emission intensity of the emission peak wavelength was found to be a count of 108.

Next, the phosphor powder was coarsely pulverized using an agate mortar, and powder X-ray diffraction measurement was performed thereon using Kα rays of Cu. As a result, a powder X-ray diffraction pattern formed by main diffraction peaks which was the same type of pattern as that obtained from Example 6 was obtained.

Example 34

A total of 100 g of raw material powder was weighed so that the same composition ratio as that of Example 22 was obtained, and was then blended for 2 hours in a wet ball mill using ethanol as the blending solvent. As a result, a slurry having a viscosity of approximately 300 cps was obtained. Note that it is also possible for hexane or the like to be used for the blending solvent.

Next, the obtained slurry is spray-dried using a spray drier that is suitable for an organic solvent so as to form a granular blended powder.

The obtained blended powder was placed in an aluminum mold, and a molded object having a bulk density of approximately 24% was prepared. This was then loaded into a crucible made of boron nitride. The ratio of the volume of the molded object to the volume of the crucible was approximately 80%. Note that each one of the respective steps, namely, the weighing of the powder, the blending, and the molding were performed in air.

The boron nitride crucible that was loaded with the blended powder was then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 500° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 11 μm (i.e., Example 34).

When light having a wavelength of 365 nm was irradiated using an ultraviolet lamp onto this phosphor powder (i.e., Example 34), it was confirmed that light was being emitted in a blue-green color.

When the emission spectrum and excitation spectrum of the phosphor powder (i.e., Example 34) were measured using a fluorospectrophotometer, it was found that the peak wavelength in the excitation spectrum was 370 nm, and that the peak wavelength in the emission spectrum resulting from the excitation by blue color light having a wavelength of 450 nm was 504 nm (i.e., a blue-green color). If the emission intensity of Example 70 was standardized as 100, the emission intensity of the emission peak wavelength was found to be a count of 107.

Next, the phosphor powder was coarsely pulverized using an agate mortar, and powder X-ray diffraction measurement was performed thereon using Kα rays of Cu. As a result, a powder X-ray diffraction pattern formed by main diffraction peaks which was the same type of pattern as that obtained from Example 1 was obtained.

Example 35

The blended powder used in Example 22 was placed in an aluminum mold, and a molded object having a bulk density of approximately 25% was prepared. This was then loaded into a crucible made of boron nitride. The ratio of the volume of the molded object to the volume of the crucible was approximately 80%. Note that each one of the respective steps, namely, the weighing of the powder, the blending, and the molding were performed in air.

The boron nitride crucible that was loaded with the blended powder was then set in a lanthanum chromite resistance-heating type of electrical furnace with an alumina fiber molded object used as insulating material. Note that absolutely no carbon-containing material was used inside the electrical furnace used in the present embodiment.

The firing was performed by, firstly, changing the firing atmosphere to a vacuum using a diffusion pump, and then heating it from room temperature to 1000° C. at a rate of 100° C. per hour. At 1000° C., nitrogen having a purity of 99.999 percent by volume was introduced, and the pressure was set to 0.9 MPa. The temperature was then raised again to 1900° C. at a rate of 100° C. per hour, and was then held at 1900° C. for two hours.

After the firing, the obtained fired object was coarsely pulverized, and was then manually pulverized using a mortar made from a silicon nitride sintered compact. Using a sieve having a mesh of 30 μm, the resulting powder was then classified so as to provide a phosphor powder having a mean particle diameter of 12 μm (i.e., Example 35).

When light having a wavelength of 365 nm was irradiated using an ultraviolet lamp onto this phosphor powder (i.e., Example 35), it was confirmed that light was being emitted in a blue-green color.

When the emission spectrum and excitation spectrum of the phosphor powder (i.e., Example 35) were measured using a fluorospectrophotometer, it was found that the peak wavelength in the excitation spectrum was 370 nm, and that the peak wavelength in the emission spectrum resulting from the excitation by blue color light having a wavelength of 450 nm was 504 nm (i.e., a blue-green color). If the emission intensity of Example 22 was standardized as 100, the emission intensity of the emission peak wavelength was found to be a count of 78.

Next, the phosphor powder was coarsely pulverized using an agate mortar, and powder X-ray diffraction measurement was performed thereon using Kα rays of Cu. As a result, a powder X-ray diffraction pattern formed by main diffraction peaks which was the same type of pattern as that obtained from Example 6 was obtained.

Examples 36 to 40

Blended powders having the same composition as in Example 22 were loaded into crucibles made of boron nitride such that the bulk densities and filling ratios shown in Table 17 were obtained. Note that each one of the respective steps, namely, the weighing of the powder, the blending, and the molding were performed in air.

The boron nitride crucibles that were loaded with the blended powder were then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 600° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired objects were coarsely pulverized, and were then manually pulverized using a mortar made from a silicon nitride sintered compact. Using a sieve having a mesh of 30 μm, the resulting powders were then classified so as to provide phosphor powders having a mean particle diameter of 12 μm (i.e., Examples 36 to 40).

When light having a wavelength of 365 nm was irradiated using an ultraviolet lamp onto these phosphor powders (i.e., Examples 36 to 40), it was confirmed that light was being emitted in a blue-green color.

When the emission spectrum and excitation spectrum of the phosphor powders (i.e., Examples 36 to 40) were measured using a fluorospectrophotometer, it was found that the peak wavelengths in the excitation spectrum were 370 nm, and that the peak wavelengths in the emission spectrum resulting from the excitation by blue color light having a wavelength of 450 nm was 504 nm (i.e., a blue-green color). The emission intensities of these phosphor powders (i.e., Examples 36 to 40) were determined with the emission intensity of Example 22 standardized as 100.

TABLE 17

|  |  | Bulk density (%) | Filling ratio (%) | Emission intensity (count) |
| --- | --- | --- | --- | --- |
| Example | 36 | 8 | 77 | 105 |
| Example | 37 | 15 | 79 | 101 |
| Example | 38 | 25 | 14 | 77 |
| Example | 39 | 24 | 49 | 91 |
| Example | 40 | 49 | 78 | 84 |

Examples 41 to 42

The phosphor powder obtained in Example 22 was pulverized using ball mills formed from the materials shown in Table 18 and using ethanol as the solvent so that the mean particle diameter was 5 μm or less. After the obtained slurries had been evaporated to dryness, the test sample of Example 42 was washed with hydrochloric acid, and was then once again evaporated to dryness. The resulting powders were loaded into boron nitride crucibles.

The boron nitride crucibles that were loaded with the test samples were then set in a graphite resistance-heating type of electrical furnace with a carbon fiber molded object used as insulating material.

The firing was performed by, firstly, changing the firing atmosphere to a vacuum using a diffusion pump, and then heating it from room temperature to 1000° C. at a rate of 600° C. per hour. At 1000° C., nitrogen having a purity of 99.999 percent by volume was introduced, and the pressure was set to 0.9 MPa. The temperature was then raised again to 1900° C. at a rate of 600° C. per hour, and was then held at 1900° C. for two hours.

After the firing, the obtained fired objects were coarsely pulverized, and were then manually pulverized using a mortar made from a silicon nitride sintered compact. Using a sieve having a mesh of 30 μm, the resulting powders were then classified so as to provide phosphor powders having a mean particle diameter of 12 μm (i.e., Examples 41 to 42).

When light having a wavelength of 365 nm was irradiated using an ultraviolet lamp onto these phosphor powders (i.e., Examples 41 to 42), it was confirmed that light was being emitted in a blue-green color.

When the emission spectrum and excitation spectrum of the phosphor powders (i.e., Examples 41 to 42) were measured using a fluorospectrophotometer, it was found that the peak wavelengths in the excitation spectrum were 370 nm, and that the peak wavelengths in the emission spectrum resulting from the excitation by blue color light having a wavelength of 450 nm was 504 nm (i.e., a blue-green color). The emission intensities of these phosphor powders (i.e., Examples 41 to 42) were determined with the emission intensity of Example 22 standardized as 100.

TABLE 18

|  |  | Pulverizing ball, Lining material | Emission intensity (count) |
|---|---|---|---|
| Example | 41 | Silicon nitride fired object | 113.000 |
| Example | 42 | Iron | 71.000 |

Examples 43 to 44

The phosphor powder obtained in Example 22 was loaded into crucibles made of boron nitride, and the boron nitride crucibles that were loaded with the test samples were then set in a graphite resistance-heating type of hot isostatic pressing apparatus with a carbon fiber molded object used as insulating material.

Thereafter, heating was performed in conditions of: an atmospheric pressure of 30 MPa and a firing temperature of 2000° C. (i.e., Example 43); and an atmospheric pressure of 50 MPa and a firing temperature of 2100° C. (i.e., Example 44). Note that a nitrogen atmosphere was employed for the firing atmosphere.

After the firing, the obtained fired objects were coarsely pulverized, and were then manually pulverized using a mortar made from a silicon nitride sintered compact. Using a sieve having a mesh of 30 the resulting powders were then classified so as to provide phosphor powders having a mean particle diameter of 11 μm (i.e., Examples 43 to 44).

When light having a wavelength of 365 nm was irradiated using an ultraviolet lamp onto these phosphor powders (i.e., Examples 43 to 44), it was confirmed that light was being emitted in a blue-green color.

When the emission spectrum and excitation spectrum of the phosphor powders (i.e., Examples 43 to 44) were measured using a fluorospectrophotometer, it was found that the peak wavelengths in the excitation spectrum were 370 nm, and that the peak wavelengths in the emission spectrum resulting from the excitation by blue color light having a wavelength of 450 nm were 504 nm (i.e., a blue-green color). The emission intensities of these phosphor powders (i.e., Examples 43 to 44) were determined with the emission intensity of Example 22 standardized as 100.

TABLE 19

|  |  | Atmospheric pressure (MPa) | Firing temperature (° C.) | Emission intensity (count) |
|---|---|---|---|---|
| Example | 43 | 30 | 2000 | 111 |
| Example | 44 | 50 | 2100 | 116 |

5.0 g of the phosphor powder obtained in Example 22 were fully dispersed in a blended solution of 20 ml of distilled water and 50 ml of isopropyl alcohol in which 1.0 g of tetraethoxysilane had been dissolved. While the dispersion solution was being vigorously stirred, 50 ml of a 15% ammonia aqueous solution was dropped into it, and the resulting solution was thereafter heated to reflux for two hours while being stirred. The obtained slurry was then filtrated, cleaned, dried, and calcinated in a nitrogen atmosphere at 600° C. so that a phosphor (i.e., Example 45) equipped with an amorphous silica coating film was obtained.

When the phosphor (i.e., Example 45) equipped with an amorphous silica coating film thus obtained was observed using a transmission electron microscope, the thickness of the silicon film was found to be approximately 70 nm. If the emission intensity of Example 22 was standardized to 100, then the emission intensity of this phosphor (i.e., Example 45) was 115. In addition, when the refractive index of a silica film obtained in the same way as that described above was measured, it was found to be 1.48. The oxygen content of the phosphor equipped with an amorphous silica coating film (i.e., Example 45) was 0.2 percent by mass greater than the oxygen content determined theoretically from Example 22.

Example 46

32 ml of 0.1M sodium hydroxide solution was added to 50 ml of 0.1 M boric acid and 0.1 M potassium chloride solution, and this was then diluted with distilled water to 100 ml. 5.0 g of the phosphor powder obtained in Example 22 was then added to this aqueous solution, and was thoroughly stirred so as to form a slurry.

10 ml of 0.1 M aluminum sulfate solution was then dropped into this slurry while the pH of the slurry was kept within a range of 9.0 to 10.5 using a sodium hydroxide solution. As a result, phosphor particles that had aluminum hydroxide micro-particles adhered to the surfaces of the particles within the slurry were obtained. After these phosphor particles were washed and dried, they were calcinated for two hours at 600° C. so that phosphor powder (i.e., Example 46) that had an alumina layer formed on the surface thereof was obtained.

When the phosphor powder (i.e., Example 46) was observed using a transmission electron microscope, the thickness of the alumina layer was found to be approximately 50 nm. If the emission intensity of Example 22 was standardized to 100, then the emission intensity of this phosphor powder (i.e., Example 46) was 112. In addition, when the refractive index of an alumina film obtained in the same way as that described above was measured, it was found to be 1.70. The oxygen content of the phosphor powder having an alumina coating film (i.e., Example 46) was 0.3 percent by mass greater than the oxygen content determined theoretically from Example 22.

Example 47

Fired lumps of a phosphor obtained in the same way as in Example 22 were lightly pulverized using a mortar made from a silicon nitride sintered object. Acid treatment was then performed on these fired lumps for 30 minutes using a blended acid solution formed by blending hydrofluoric acid having a concentration of 48%, sulfuric acid having a normality of 36N, and distilled water in a volume ratio of 5:5:390, while this blended acid solution was vigorously stirred. Thereafter, the phosphor powder was separated, washed, dried, and treated so as to obtain a phosphor powder (i.e., Example 47).

When the shape of the phosphor powder (i.e., Example 47) was observed using a scanning electron microscope, no grain boundary phase or vitreous second phase was observed, and it was found that the phosphor particles were formed by single crystal particles having a euhedral face.

When light having a wavelength of 365 nm was irradiated using an ultraviolet lamp onto this phosphor powder (i.e., Example 47), it was confirmed that light was being emitted in a blue-green color.

When the emission spectrum and excitation spectrum of the phosphor powder (i.e., Example 47) were measured using a fluorospectrophotometer, it was found that the peak wavelength in the excitation spectrum was 370 nm, and that the peak wavelength in the emission spectrum resulting from the excitation by blue color light having a wavelength of 450 nm was 504 nm (i.e., a blue-green color). If the emission intensity of Example 22 is standardized as 100, then the emission intensity of this phosphor powder (i.e., Example 47) was determined to be 118.

Next, a light-emitting device that uses the phosphor of the present invention will be described.

Example 48

A molded type white light-emitting diode lamp (i.e., light-emitting device) such as that shown in FIG. 1 was prepared using the phosphor of the present invention.

Firstly, a blue light-emitting diode element was bonded using conductive paste inside a recessed portion for housing elements which was located in a first lead wire such that the first lead wire and the bottom electrode of the blue light-emitting diode element were electrically connected together, and such that the blue light-emitting diode element was fixed in that position. Next, the top electrode of the blue light-emitting diode element and the second lead wire were wire-bonded together using bonding wire so that they were electrically connected together.

Next, a suitable quantity of a previously prepared resin in which phosphors had been dispersed was coated by means of a dispenser inside the recessed portion such that it covered the blue light-emitting diode element. This was then cured so as to form a first resin.

Lastly, the entire distal end portion of the first lead wire including the recessed portion, blue light-emitting diode element, and first resin in which the phosphors had been dispersed were all sealed with a second resin by casting method.

An epoxy resin having a refractive index of 1.6 was used for the first resin, while an epoxy resin having a refractive index of 1.36 was used for the second resin.

In the present example, the phosphor of Example 22 serving as a blue-green phosphor, and a $CaAlSiN_3$:Eu phosphor serving as a red phosphor were mixed in concentrations of 15% by mass and 26% by mass respectively in an epoxy resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22 and the red phosphor that were excited by this respectively emitted blue-green light and red light, and these lights were mingled together so that white light was emitted.

Example 49

Other than changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a β-sialon phosphor serving as a green phosphor, and a $CaAlSiN_3$:Eu phosphor serving as a red phosphor were mixed in concentrations of 15% by mass, 12% by mass, and 26% by mass respectively in an epoxy resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, and the red phosphor that were excited by this respectively emitted blue-green light, green light, and red light, and these lights were mingled together so that white light was emitted.

Example 50

Other than changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a $Ca_3Sc_2Si_3O_{12}$:Ce phosphor serving as a green phosphor, and a $CaAlSiN_3$:Eu phosphor serving as a red phosphor were mixed in concentrations of 15% by mass, 13% by mass, and 26% by mass respectively in an epoxy resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, and the red phosphor that were excited by this respectively emitted blue-green light, green light, and red light, and these lights were mingled together so that white light was emitted.

Example 51

Other than changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a β-sialon phosphor serving as a green phosphor, a YAG:Ce phosphor serving as a yellow phosphor, and a CaAlSiN$_3$:Eu phosphor serving as a red phosphor were mixed in concentrations of 15% by mass, 13% by mass, 18% by mass, and 26% by mass respectively in an epoxy resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, the yellow phosphor, and the red phosphor that were excited by this respectively emitted blue-green light, green light, yellow light, and red light, and these lights were mingled together so that white light which was close to natural light was emitted.

Example 52

Other than changing the light-emitting element (i.e., the LED) and the phosphor that were used, a molded type white light-emitting diode lamp (i.e., light-emitting device) such as that shown in FIG. 1 was prepared in the same way as in Example 48.

A structure was employed in which an ultraviolet LED element having an emission peak wavelength of 380 nm was used as the light-emitting element (i.e., the LED), and the phosphor of Example 22, the phosphor of Example 14, a BaMgAl$_{10}$O$_{17}$:Eu phosphor, and CaAlSiN$_3$:Eu phosphor serving as a red phosphor were dispersed in a resin layer made from silicone resin, and this was then used to cover the ultraviolet LED element.

When current was supplied to a conductive terminal, the LED element emitted ultraviolet light having an emission peak wavelength of 380 nm. The phosphor of Example 22, the phosphor of Example 14, the BaMgAl$_{10}$O$_{17}$:Eu phosphor, and the red phosphor that were excited by this respectively emitted blue-green light, green light, yellow light, and red light, and these lights were mingled together so that white light was emitted.

Example 53

Other than using a silicone resin having a refractive index of 1.51 for the first resin, and a silicone resin having a refractive index of 1.41 for the second resin, and changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, and a CaAlSiN$_3$:Eu phosphor serving as a red phosphor were mixed in concentrations of 15% by mass and 26% by mass respectively in a silicone resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22 and the red phosphor that were excited by this respectively emitted blue-green light and red light, and these lights were mingled together so that white light was emitted.

Example 54

Other than using a silicone resin having a refractive index of 1.51 for the first resin, and a silicone resin having a refractive index of 1.41 for the second resin, and changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a β-sialon phosphor serving as a green phosphor, and a CaAlSiN$_3$:Eu phosphor serving as a red phosphor were mixed in concentrations of 15% by mass, 12% by mass, and 26% by mass respectively in a silicone resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, and the red phosphor that were excited by this respectively emitted blue-green light, green light, and red light, and these lights were mingled together so that white light was emitted.

Example 55

Other than using a silicone resin having a refractive index of 1.51 for the first resin, and a silicone resin having a refractive index of 1.41 for the second resin, and changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a Ca$_3$Sc$_2$Si$_3$O$_{12}$:Ce phosphor serving as a green phosphor, and a CaAlSiN$_3$:Eu phosphor serving as a red phosphor were mixed in concentrations of 15% by mass, 13% by mass, and 26% by mass respectively in a silicone resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, and the red phosphor that were excited by this respectively emitted blue-green light, green light, and red light, and these lights were mingled together so that white light was emitted.

Example 56

Other than using a silicone resin having a refractive index of 1.51 for the first resin, and a silicone resin having a refractive index of 1.41 for the second resin, and changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a β-sialon phosphor serving as a green phosphor, an α-sialon phosphor serving as a yellow phosphor, and a CaAlSiN$_3$:Eu phosphor serving as a red phosphor were mixed in concentrations of 15% by mass, 13% by mass, 18% by mass, and 26% by mass respectively in a silicone resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, the yellow phosphor, and the red phosphor that were excited by this respectively emitted blue-green light, green light, yellow light, and red light, and these lights were mingled together so that white light which was close to natural light was emitted.

Example 57

Other than using a silicone resin having a refractive index of 1.51 for the first resin, and a silicone resin having a refractive index of 1.41 for the second resin, and changing the phosphor that was used, a molded type white light-emitting diode lamp (i.e., light-emitting device) such as that shown in FIG. 1 was prepared in the same way as in Example 48.

In the present example, the phosphor of Example 22 serving as a blue-green phosphor, a β-sialon phosphor serving as a green phosphor, a YAG:Ce phosphor serving as a yellow phosphor, and a $CaAlSiN_3$:Eu phosphor serving as a red phosphor were mixed in concentrations of 15% by mass, 13% by mass, 18% by mass, and 26% by mass respectively in a silicone resin, and a suitable quantity of this was then dropped by means of a dispenser so as to form the first resin in which the phosphors were dispersed.

When current was supplied to a conductive terminal, the LED element emitted blue light having an emission peak wavelength of 450 nm. The phosphor of Example 22, the green phosphor, the yellow phosphor, and the red phosphor that were excited by this respectively emitted blue-green light, green light, yellow light, and red light, and these lights were mingled together so that white light which was close to natural light was emitted.

Example 58

A substrate-mounted chip type of white light-emitting diode lamp (i.e., light-emitting device) such as that shown in FIG. 2 was prepared using the phosphor of the present invention.

Firstly, a blue light-emitting diode was placed substantially in the center portion of an alumina ceramic substrate on which a first lead wire and a second lead wire were connected together, and the bottom electrode of that blue light-emitting diode was connected to the first lead wire, while the top electrode thereof was connected by bonding wire to the second lead wire. A wall surface component having a hole was placed on the surface on the light-emitting element side of the alumina ceramic substrate, and the wall surface component was fixed in position such that it enclosed the light-emitting element in that hole. Next, after a first resin (i.e., a sealing resin) had been formed such that it covered the blue light-emitting diode, a second resin (i.e., another sealing resin) which did not contain a phosphor was formed such that it covered the first resin and filled the hole.

Note that, other than the manufacturing process to fix the first lead wire, the second lead wire, and the wall surface component to the alumina ceramic substrate, the manufacturing process was substantially the same as that of Example 48.

In the present example, the wall surface component is formed from white silicone resin, and the same epoxy resin is used for both the first resin and the second resin.

For the phosphor, the phosphor of Example 22, the phosphor of Example 14 serving as a green phosphor, and a $CaAlSiN_3$:Eu phosphor serving as a red phosphor were used. As a result, when current was supplied to the conductive terminal, it was confirmed that a white color was emitted.

Example 59

A substrate-mounted chip type of white light-emitting diode lamp (i.e., light-emitting device) such as that shown in FIG. 3 was prepared.

Firstly, a blue light-emitting diode (i.e., a blue LED chip) having an emission peak at 450 nm was die-bonded by means of a resin paste onto a lead frame of a case for a surface-mounted LED package that was formed by a reflector and by a substrate that was molded from nylon resin and that included a silver-plated, copper lead frame. Note that blue light-emitting diodes in the form of 350 μm square were used for the blue light-emitting diodes, and a total of three of these were mounted.

Next, the two electrodes on the top side of the blue light-emitting diode were connected together by two bonding wires (i.e., fine gold wires), and one of these bonding wires was connected to a lead frame, while the other bonding wire was connected to the other lead frame.

Next, a suitable quantity of methyl silicone resin which contained the phosphors was dropped such that it covered the light-emitting diode element and filled the hole in the wall surface component. After this resin had cured, light-emitting device packages were trimmed from the integrated single component. These light-emitting device package pieces were then selected based on their color tone and light-emitting intensity, so that substrate-mounted chip type white light-emitting diode lamps were obtained.

In the present example, the phosphor of Example 22 and a sialon phosphor were used for the phosphor. The emission efficiency of the light-emitting device was 100 μm/W, and it was confirmed that a white color having a color temperature of approximately 5500 K was emitted.

The color rendering of the light-emitting device was approximately 90 Ra. The supplied power was 0.18 W per package that is equivalent to a surface area power density of $2 \times 10^4$ $W/m^2$ for each LED chip.

Example 60

Other than using an ultraviolet LED chip for the light-emitting diode element, and forming a pattern made of Cu as a printed circuit on a substrate molded from a ceramic, and using a case for a surface-mounted LED package to which a ceramic reflector had been adhered, and changing the phosphor, a substrate-mounted chip type of white light-emitting diode lamp (i.e., light-emitting device) such as that shown in FIG. 3 was prepared in the same way as in Example 59.

In the present example, the phosphor of Example 22, a sialon phosphor, and a CaAlSiN-based phosphor were used for the phosphor. The emission efficiency of the light-emitting device was 120 lm/W, and it was confirmed that a white color having a color temperature of approximately 5600 K was emitted.

The color rendering of the light-emitting device was approximately 98 Ra. The supplied power was 0.18 W per package that is equivalent to a surface area power density of $2 \times 10^4$ $W/m^2$ for each LED chip.

Example 61

Other than using a blue light-emitting diode (i.e., a blue LED chip) having an emission peak at 440 nm as the light-emitting diode element, and mounting a single large-sized chip in the form of a square whose sides were 1 mm long, a substrate-mounted chip type of white light-emitting diode lamp (i.e., light-emitting device) such as that shown in FIG. 3 was prepared in the same way as in Example 59.

In the present example, the phosphor of Example 22 and a sialon phosphor were used for the phosphor. The emission efficiency of the light-emitting device was 90 μm/W, and it was confirmed that a white color having a color temperature of approximately 5000 K was emitted.

The color rendering of the light-emitting device was approximately 87 Ra. The supplied power was 1 W per package that is equivalent to a surface area power density of $1\times10^3$ W/m$^2$ for each LED chip.

Example 62

Other than using a blue light-emitting diode (i.e., a blue LED chip) having an emission peak at 470 nm as the light-emitting diode element, and forming a second resin in which no phosphor had been dispersed, a substrate-mounted chip type of white light-emitting diode lamp (i.e., light-emitting device) such as that shown in FIG. 4 was prepared in the same way as in Example 59.

Note that a phenyl silicone resin which did not include a phosphor was used as the second resin.

In the present example, the phosphor of Example 22 and a sialon phosphor were used for the phosphor. The emission efficiency of the light-emitting device was 110 lm/W, and it was confirmed that a white color having a color temperature of approximately 5200 K was emitted.

The color rendering of the light-emitting device was approximately 93 Ra. The supplied power was 0.18 W per package that is equivalent to a surface area power density of $2\times10^4$ W/m$^2$ for each LED chip.

Example 63

Other than not using a first resin, and forming a 10 μm thick layer of the phosphor of the present invention using a sputtering method on a transparent electrode on the p-side of a blue light-emitting diode (i.e., a blue LED chip), and forming a second resin in which no phosphor had been dispersed, a substrate-mounted chip type of white light-emitting diode lamp (i.e., light-emitting device) such as that shown in FIG. 5 was prepared in the same way as in Example 59.

In the present example, the phosphor of Example 22 and a sialon phosphor were used for the phosphor. The emission efficiency of the light-emitting device was 140 μm/W, and it was confirmed that a white color having a color temperature of approximately 4500 K was emitted.

The color rendering of the light-emitting device was approximately 85 Ra. The supplied power was 0.18 W per package that is equivalent to a surface area power density of $2\times10^4$ W/m$^2$ for each LED chip.

Example 64

A blue light-emitting diode (i.e., a blue LED chip) was mounted directly on a printed wiring epoxy substrate which contained glass. This was then sealed with resin so as to prepare what is known as a chip-on-board (COB) type of white light-emitting diode (i.e., light-emitting device).

The blue light-emitting diode (i.e., the blue LED chip) was mounted on an aluminum substrate, and the printed wiring, glass-containing epoxy substrate was superimposed on this and was then adhered thereto.

A hole was formed in the portion of the substrate where the blue light-emitting diode (i.e., the blue LED chip) was mounted so that the blue light-emitting diode (i.e., the blue LED chip) was visible on the surface. The blue light-emitting diode (i.e., the blue LED chip) and the wiring were connected together by a gold wire. A suitable quantity of methyl silicone resin which contained a phosphor was then dropped onto the top of this and was allowed to cure.

In the present example, the phosphor of Example 22 and a sialon phosphor were used for the phosphor. The emission efficiency of the light-emitting device was 100 μm/W, and it was confirmed that a white color having a color temperature of approximately 5500 K was emitted. The color rendering of the light-emitting device was approximately 90 Ra.

Example 65

Other than using an ultraviolet light-emitting diode (i.e., an ultraviolet LED chip) having an emission peak at 390 nm as the light-emitting diode element, and forming a pattern made of Cu as a printed circuit on a substrate molded from a ceramic, and using a case for a surface-mounted LED package to which a ceramic reflector had been adhered, and changing the phosphor, a substrate-mounted chip type of white light-emitting diode lamp (i.e., light-emitting device) such as that shown in FIG. 3 was prepared in the same way as in Example 59.

In the present example, only the phosphor of Example 14 was used for the phosphor. The emission output of the light-emitting device was 18 mW. The current was changed from 100 μA to 50 mA, however, there was essentially no change in the emission wavelength relative to the amount of current.

Example 66

Other than using an ultraviolet light-emitting diode (i.e., an ultraviolet LED chip) having an emission peak at 390 nm as the light-emitting diode element, and forming a pattern made of Cu as a printed circuit on a substrate molded from a ceramic, and using a case for a surface-mounted LED package to which a ceramic reflector had been adhered, and changing the phosphor, a substrate-mounted chip type of white light-emitting diode lamp (i.e., light-emitting device) such as that shown in FIG. 3 was prepared in the same way as in Example 59.

In the present example, only the phosphor of Example 24 was used for the phosphor. The emission output of the light-emitting device was 40 mW. The current was changed from 100 μA to 50 mA, however, there was essentially no change in the emission wavelength relative to the amount of current.

Example 67

Other than using an ultraviolet light-emitting diode (i.e., an ultraviolet LED chip) having an emission peak at 390 nm as the light-emitting diode element, and forming a pattern made of Cu as a printed circuit on a substrate molded from a ceramic, and using a case for a surface-mounted LED package to which a ceramic reflector had been adhered, and changing the phosphor, a substrate-mounted chip type of white light-emitting diode lamp (i.e., light-emitting device) such as that shown in FIG. 3 was prepared in the same way as in Example 59.

In the present example, only the phosphor of Example 22 was used for the phosphor. The emission output of the light-emitting device was 35 mW. The current was changed from 100 μA to 50 mA, however, there was essentially no change in the emission wavelength relative to the amount of current.

Example 68

Other than changing the phosphor, a substrate-mounted chip type of white light-emitting diode lamp (i.e., light-emitting device) such as that shown in FIG. 3 was prepared in the same way as in Example 59.

In the present example, the phosphor of Example 22, a sialon phosphor, and a CaAlSiN phosphor were used for the phosphor. The emission efficiency of the light-emitting device was 120 μm/W, and it was confirmed that a white color having a color temperature of approximately 5300 K was emitted.

The color rendering of the light-emitting device was approximately 96 Ra. The supplied power was 0.18 W per package that is equivalent to a surface area power density of $2 \times 10^4$ W/m² for each LED chip.

Example 69

Other than changing the phosphor, a substrate-mounted chip type of white light-emitting diode lamp (i.e., light-emitting device) such as that shown in FIG. 3 was prepared in the same way as in Example 59.

In the present example, a phosphor obtained by mixing together the phosphors of Example 1 through Example 25, and a CaAlSiN phosphor were used for the phosphor. The emission efficiency of the light-emitting device was 100 μm/W, and it was confirmed that a white color having a color temperature of approximately 5500 K was emitted. The color rendering of the light-emitting device was approximately 99 Ra. The supplied power was 0.18 W per package that is equivalent to a surface area power density of $2 \times 10^4$ W/m² for each LED chip.

INDUSTRIAL APPLICABILITY

The phosphor of the present invention is a nitride phosphor that has a higher emission intensity than a conventional sialon or oxynitride phosphor, and is superior as a phosphor, and exhibits little reduction in the luminance of the phosphor even when it is exposed to an excitation source. As a result, it is favorably used in white LED, white inorganic EL, and white organic EL, and the like. It can be anticipated that the phosphor of the present invention will be widely used in future in the designing of materials for light-emitting devices such as various illumination devices and display devices and the like, and will greatly contribute to industrial progress.

DESCRIPTION OF THE REFERENCE NUMERALS

1 ... Molded type light-emitting diode lamp (light-emitting device: LED device), 2 ... First lead wire (Lead frame), 3 ... Second lead wire (Lead frame), 4 ... Light-emitting diode element (LED chip), 4a, 4b ... Electrodes, 5 ... Bonding wire, 6 ... First resin (Sealing resin), 7 ... Phosphor, 8 ... Second resin (Sealing resin), 11 ... Substrate-mounted chip type light-emitting diode lamp (light-emitting device: LED device), 12 ... First lead wire (Lead frame), 13 ... Second lead wire (Lead frame), 15 ... Bonding wire (Fine gold wire), 16 ... First resin (Sealing resin), 17 ... Phosphor, 18 ... Second resin (Sealing resin), 19 ... Substrate (Alumina ceramic or resin-molded), 20 ... Side surface component (wall surface component), 20a ... Hole, 20b ... Sloping surface (Reflective surface), 23 ... Phosphor, 24 ... Light-emitting diode element (LED chip), 24a, 24b ... Electrodes, 111, 112, 113 ... Substrate-mounted chip type light-emitting diode lamp (light-emitting device: LED device)

The invention claimed is:

1. A phosphor comprising:
a luminescent material expressed by the general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by 0<x<1), wherein
the value of n/m is $(8/5) < n/m < (5/3)$.

2. The phosphor according to claim 1, wherein the element A is one or more types selected from Ca, Sr, Ba and La.

3. The phosphor according to claim 1, wherein the element R is Eu.

4. The phosphor according to claim 1, wherein the element M is one or more types selected from Si and Al.

5. The phosphor according to claim 1, wherein the luminescent material is expressed by the general formula $(A_{1-x}R_x)_mSi_{6n-5m-s}Al_{7m-4n+s}O_sN_{m+4n-s}$ (wherein s is a real number defined by $0 \le s \le m$).

6. The phosphor according to claim 1, wherein the concentration of the luminescent material is 80% by volume or more, and the remainder is one or more types selected from β-sialon, unreacted silicon nitride or aluminum nitride, oxynitride glass, $SrSiAl_2N_2O_3$, $Sr_2Al_2Si_{10}N_{14}O_4$, $SrSi_{(10-n)}Al_{(18+n)}O_nN_{(32-n)}$(n~1), and $SrSi_6N_8$.

7. A light-emitting device that is provided with an emission light source and a phosphor to be excited by the emission light source to emit fluorescent light, wherein the phosphor described in claim 1 is used for the phosphor.

8. The light-emitting device according to claim 7, wherein the phosphor further contains one or more types of phosphor selected from β-SiAlON: Eu, YAG:Ce, (Ca, Sr, Ba)$_2$SiO$_4$:Eu, α-SiAlON:Eu, (Ca, Sr, Ba)$_2$Si$_5$N$_8$:Eu, and (Ca, Sr) AlSiN$_3$:Eu.

9. The light-emitting device according to claim 7, wherein the emission light source is at least one selected from the group consisting of an LED chip, an inorganic EL chip and an organic EL chip, that emit lights having a wavelength of 330 to 500 nm.

10. The light-emitting device according to claim 7, wherein the emission light source is an LED chip that emits light having a wavelength of 330 to 500 nm, and the phosphor is dispersed in a sealing resin that is formed so as to enclose the LED chip.

11. The light-emitting device according to claim 10, wherein the phosphor is dispersed in the sealing resin such that it is densely dispersed in a vicinity of the LED chip.

12. The light-emitting device according to claim 7, wherein the emission light source is an LED chip that emits light having a wavelength of 330 to 500 nm, and the phosphor is directly adhered to the LED chip.

13. The light-emitting device according to claim 12, wherein the phosphor is directly adhered such that it covers at least one surface of the LED chip.

14. The light-emitting device according to claim 13, wherein the phosphor has a layer structure.

15. The light-emitting device according to claim 7, wherein the light-emitting device contains a plurality of LED chips.

16. The phosphor according to claim 1, wherein the value of x is $0 < x \le 0.2$.

17. A method of manufacturing a phosphor comprising: a mixing step in which a starting raw material is mixed so as to prepare a mixed raw material; a firing step in which this mixed raw material is fired; and a heat treatment step in which the mixed raw material obtained in the previous step is heat treated, wherein the phosphor comprises a luminescent material expressed by the general formula $(A_{1-x}R_xM_2X)_m(M_2X_4)_n$ (wherein the element A is one or more types of element selected from Li, Na, Be, Mg, Ca, Sr, Ba, Sc, Y, La, Gd, and Lu, the element R is one or more types of activating agent selected from Mn, Ce, Pr, Nd, Sm, Eu, Tb, Dy, Ho, Er, Tm, and Yb, the element M is one or more types of element selected from Si, Ge, Sn, Ti, Hf, Zr, Be, B, Al, Ga, In, Tl, and Zn, the element X is one or more types of element selected from oxygen and nitrogen, n and m are integers of 1 or more, and x is a real number defined by $0<x<1$), wherein the value of n/m is $(8/5)<n/m<(5/3)$.

18. The method of manufacturing a phosphor according to claim 17, wherein there are further provided:

a first pulverizing and classifying step in which the mixed raw material obtained from the firing step is pulverized and classified; and a second pulverizing and classifying step in which the mixed raw material obtained from the heat treatment step is pulverized and classified, and the aforementioned previous step is the first pulverizing and classifying step.

19. The method of manufacturing a phosphor according to claim 17, wherein the starting raw material contains $LiSi_2N_3$.

20. The method of manufacturing a phosphor according to claim 17, wherein a powder of a target phosphor is synthesized in advance, and this is added as a seed to the mixed raw material.

21. The method of manufacturing a phosphor according to claim 17, wherein the value of x is $0<x\leq0.2$.

22. The method of manufacturing a phosphor according to claim 17, wherein when the element A is La, the starting raw material contains $LaSi_3N_5$.

23. The method of manufacturing a phosphor according to claim 17, wherein when the element A is one or more types of element selected from elements that have a bivalent valency, the starting raw material contains one or more types of raw material selected from $ASi_2$, $ASiN_2$, $A_2Si_5N_8$, $A_3Al_2N_4$, and $ASi_6N_8$.

* * * * *